(12) United States Patent
Chiang et al.

(10) Patent No.: US 11,430,892 B2
(45) Date of Patent: Aug. 30, 2022

(54) INNER SPACERS FOR GATE-ALL-AROUND TRANSISTORS

(71) Applicant: Taiwan Semiconductor Manufacturing Co., Ltd., Hsinchu (TW)

(72) Inventors: Kuo-Cheng Chiang, Hsinchu County (TW); Zhi-Chang Lin, Hsinchu County (TW); Shih-Cheng Chen, New Taipei (TW); Chih-Hao Wang, Hsinchu County (TW); Pei-Hsun Wang, Hsinchu (TW); Lo-Heng Chang, Hsinchu (TW); Jung-Hung Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 16 days.

(21) Appl. No.: 16/704,110

(22) Filed: Dec. 5, 2019

(65) Prior Publication Data

US 2020/0381545 A1    Dec. 3, 2020

Related U.S. Application Data

(60) Provisional application No. 62/853,954, filed on May 29, 2019.

(51) Int. Cl.
  *H01L 29/78*    (2006.01)
  *H01L 29/66*    (2006.01)
  *H01L 29/417*   (2006.01)

(52) U.S. Cl.
  CPC ...... *H01L 29/785* (2013.01); *H01L 29/41791* (2013.01); *H01L 29/66795* (2013.01); *H01L 2029/7858* (2013.01)

(58) Field of Classification Search
  CPC ............ H01L 29/785; H01L 29/66795; H01L 29/41791; H01L 2029/7858; H01L 29/045; H01L 29/0847; H01L 27/092; H01L 29/1079; H01L 29/0653; H01L 29/0673; H01L 29/775; H01L 29/0669–068; H01L 29/0665; H01L 2924/13061;
  (Continued)

(56) References Cited

U.S. PATENT DOCUMENTS 8,963,258 B2   2/2015   Yu et al.
9,818,872 B2  11/2017   Ching et al.
(Continued)

OTHER PUBLICATIONS

Wang, Pei-Hsun et al., "Selective Inner Spacer Implementations," U.S. Appl. No. 16/583,388, filed Sep. 26, 2019, 69 pages.

*Primary Examiner* — Shahed Ahmed
(74) *Attorney, Agent, or Firm* — Haynes and Boone, LLP

(57) ABSTRACT

A semiconductor device and a method of forming the same are provided. A semiconductor device according to the present disclosure includes a first source/drain feature, a second source/drain feature, a first semiconductor channel member and a second semiconductor channel member extending between the first and second source/drain features, and a first dielectric feature and a second dielectric feature each including a first dielectric layer and a second dielectric layer different from the first dielectric layer. The first and second dielectric features are sandwiched between the first and second semiconductor channel members.

20 Claims, 22 Drawing Sheets

(58) Field of Classification Search
CPC ......... H01L 29/66439; H01L 29/66469; H01L 29/78687; B82Y 10/00; Y10S 977/938
See application file for complete search history.

(56) References Cited

U.S. PATENT DOCUMENTS

| | | | |
|---|---|---|---|
| 9,887,269 B2 | 2/2018 | Ching et al. | |
| 9,899,398 B1 | 2/2018 | Colinge et al. | |
| 10,032,627 B2 | 7/2018 | Lee et al. | |
| 10,109,721 B2 | 10/2018 | Lin et al. | |
| 10,157,799 B2 | 12/2018 | Ching et al. | |
| 10,199,502 B2 | 2/2019 | Huang et al. | |
| 10,290,546 B2 | 5/2019 | Chiang et al. | |
| 10,516,064 B1 * | 12/2019 | Cheng | H01L 21/823412 |
| 2018/0175036 A1 | 6/2018 | Ching et al. | |
| 2018/0294331 A1 * | 10/2018 | Cho | H01L 29/0607 |
| 2019/0006485 A1 * | 1/2019 | Kim | H01L 29/66795 |
| 2019/0067441 A1 * | 2/2019 | Yang | H01L 21/31111 |
| 2019/0326395 A1 * | 10/2019 | Ando | H01L 29/0673 |
| 2020/0365692 A1 * | 11/2020 | Jung | H01L 27/088 |

* cited by examiner

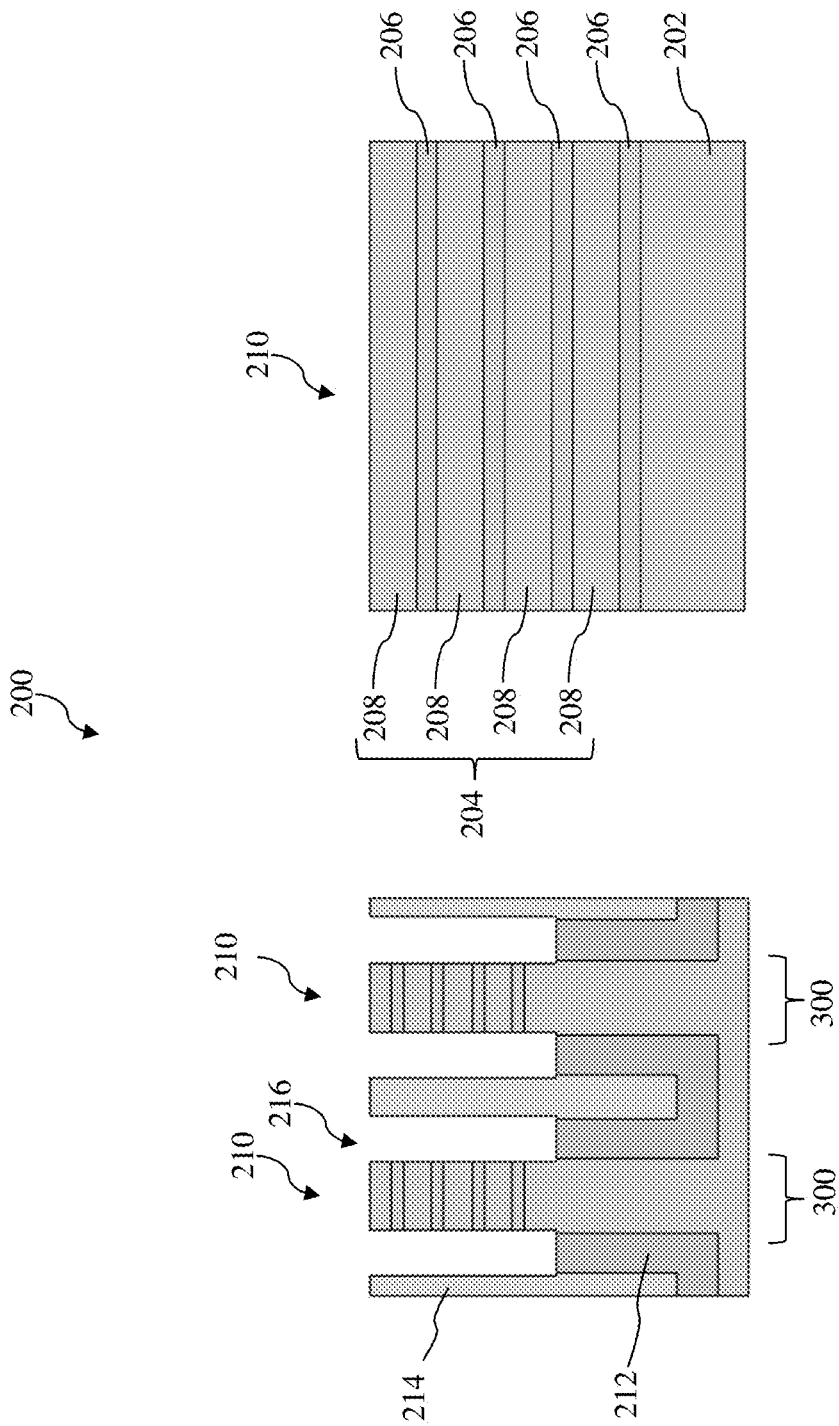

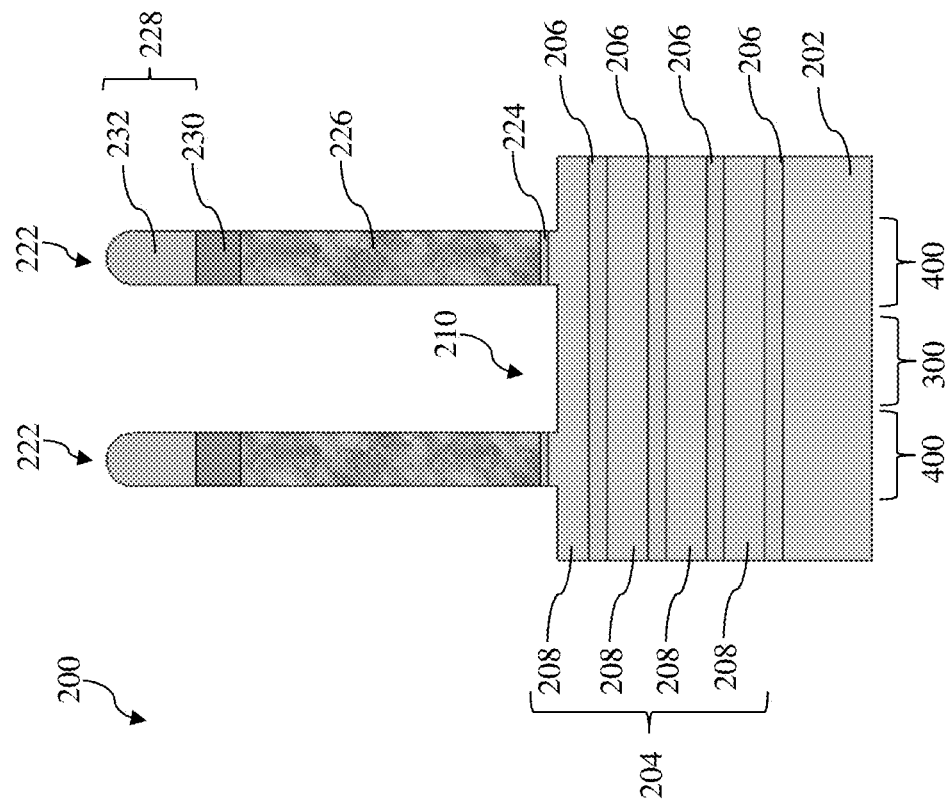
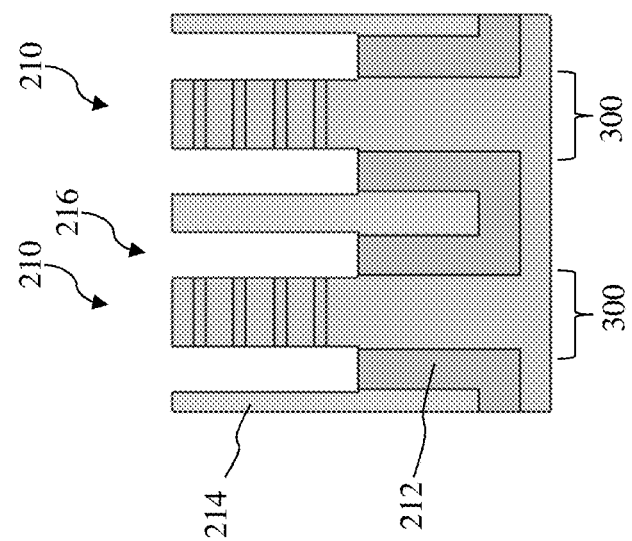
Fig. 3B
Fig. 3A

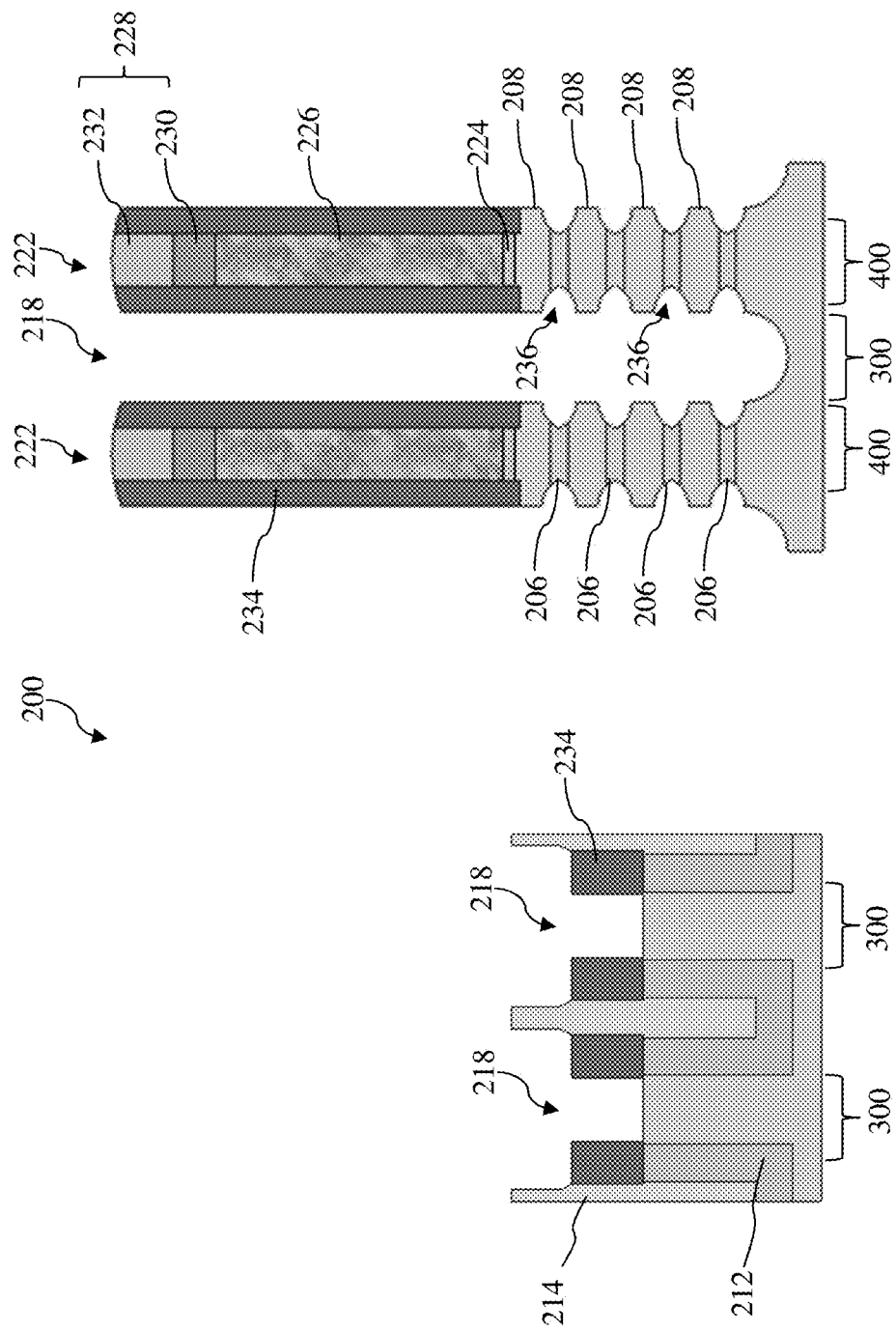

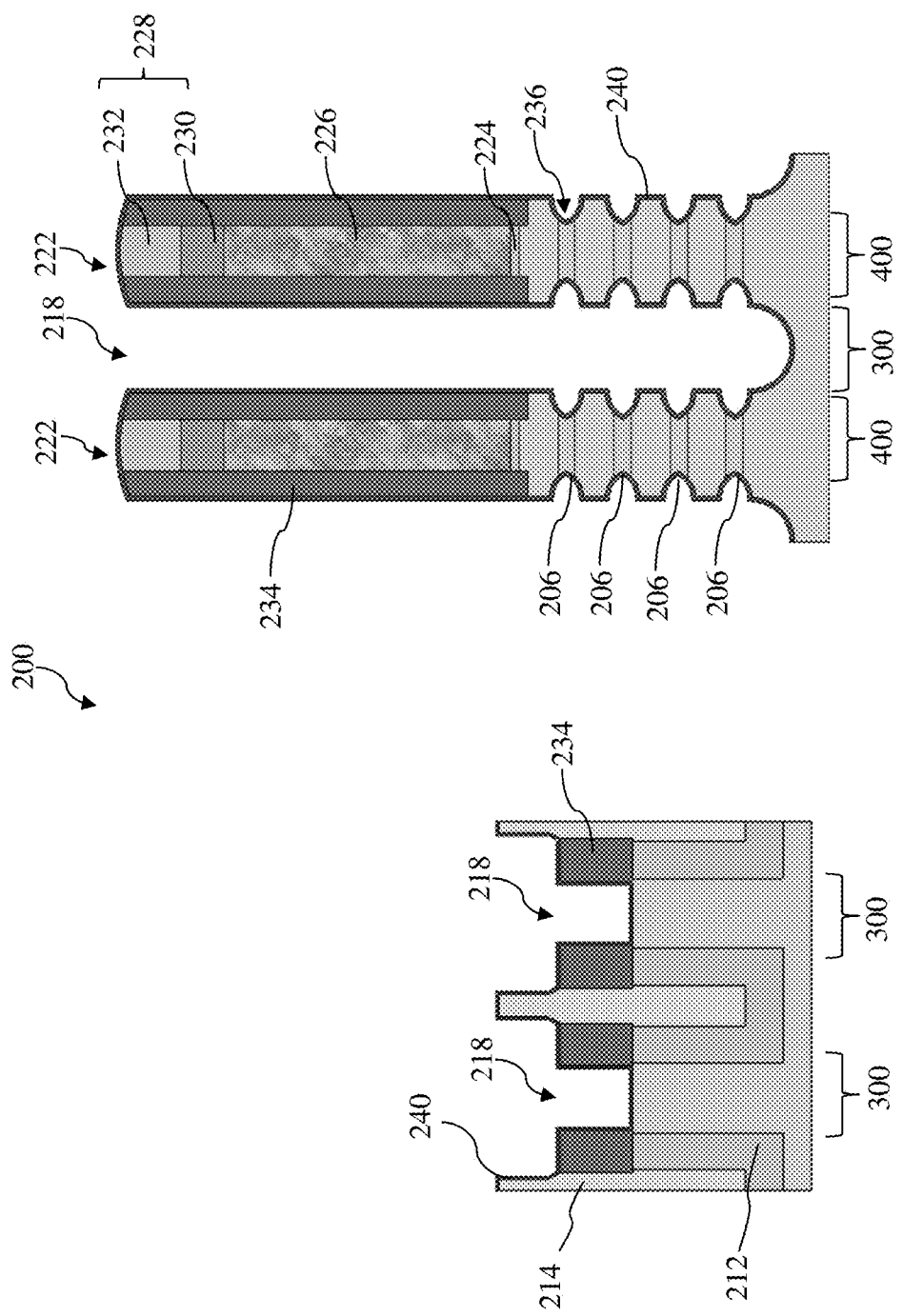

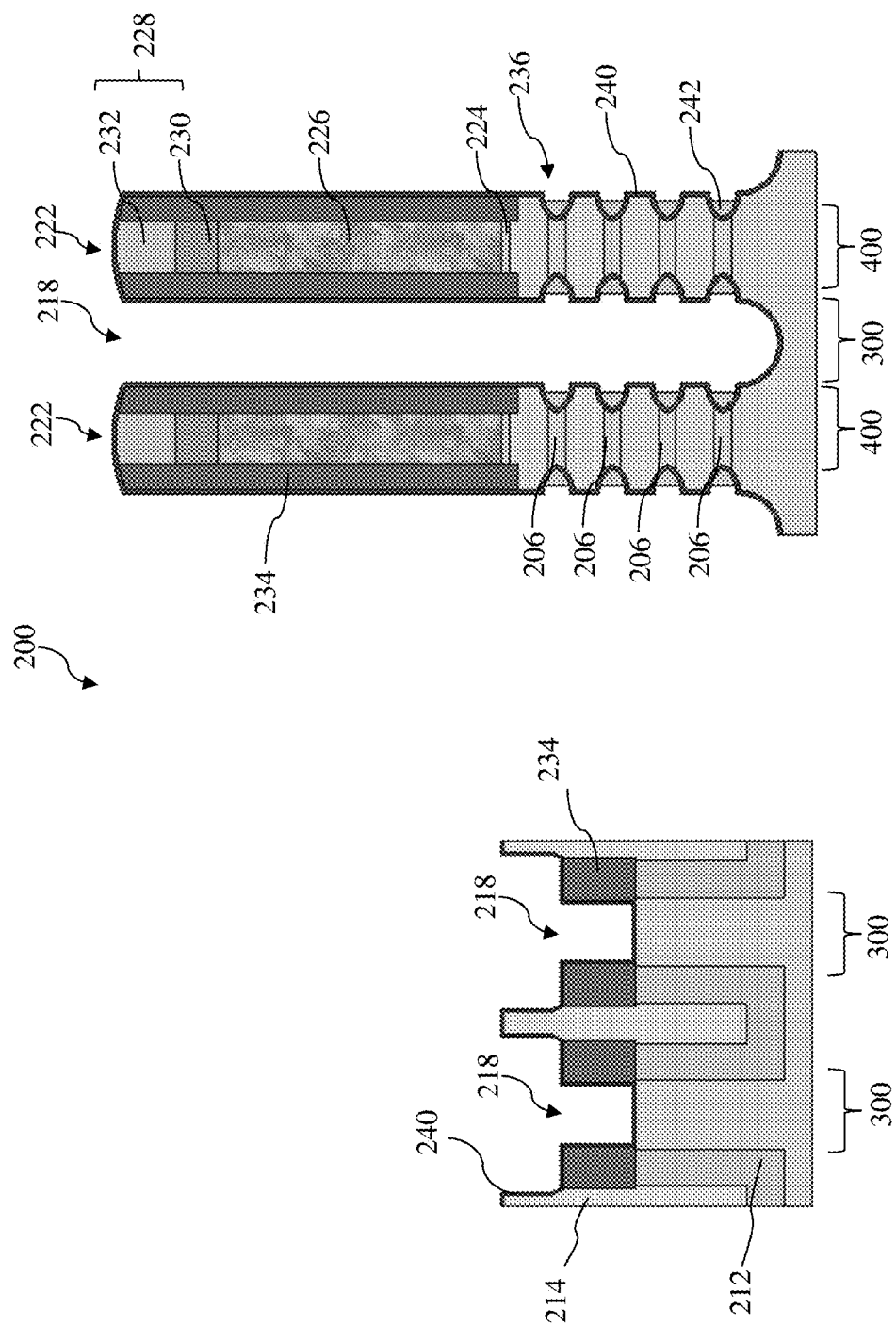

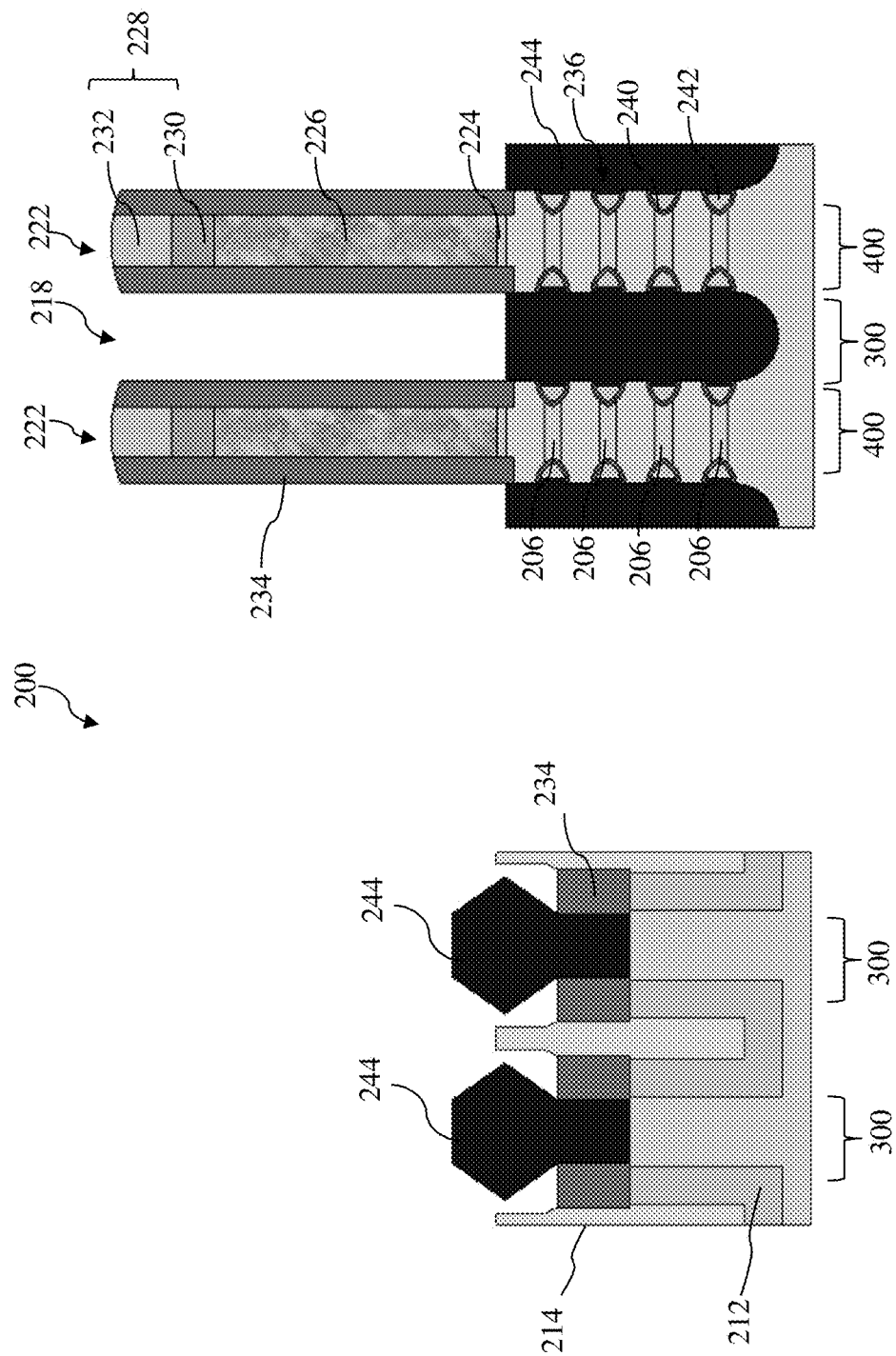

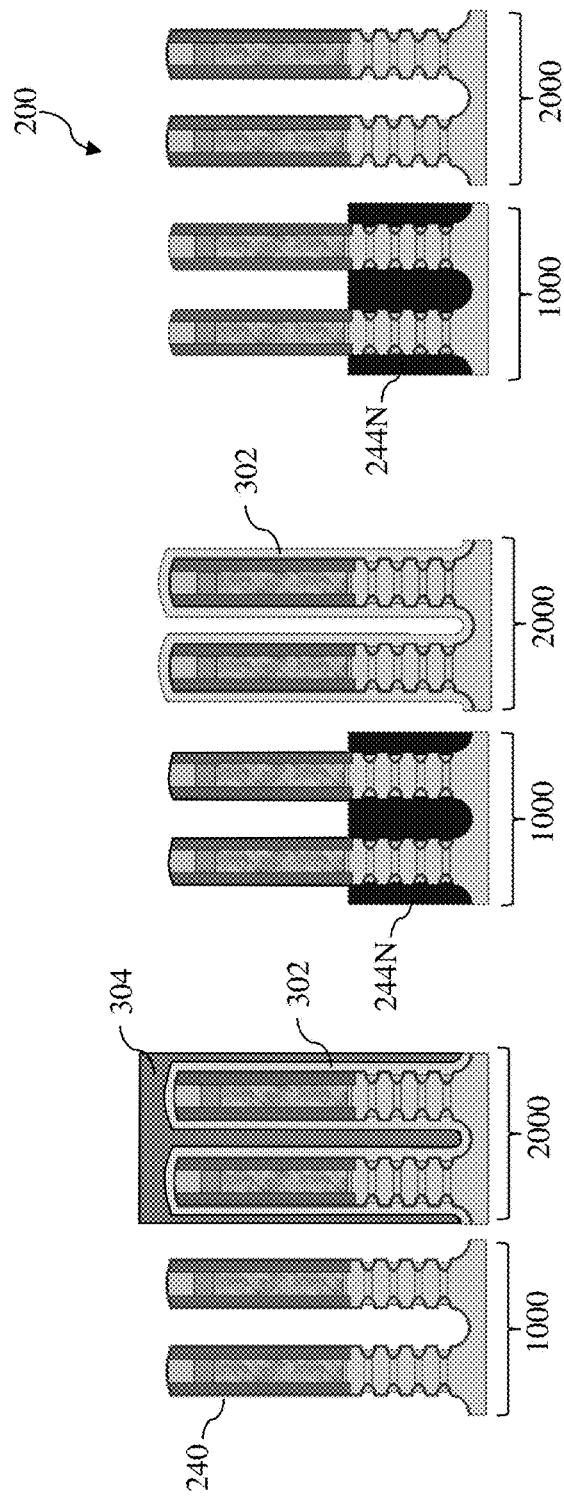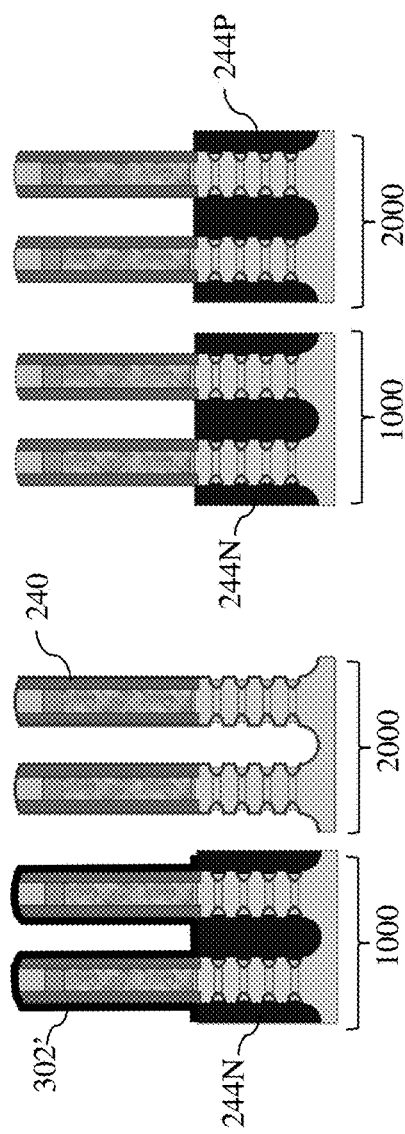

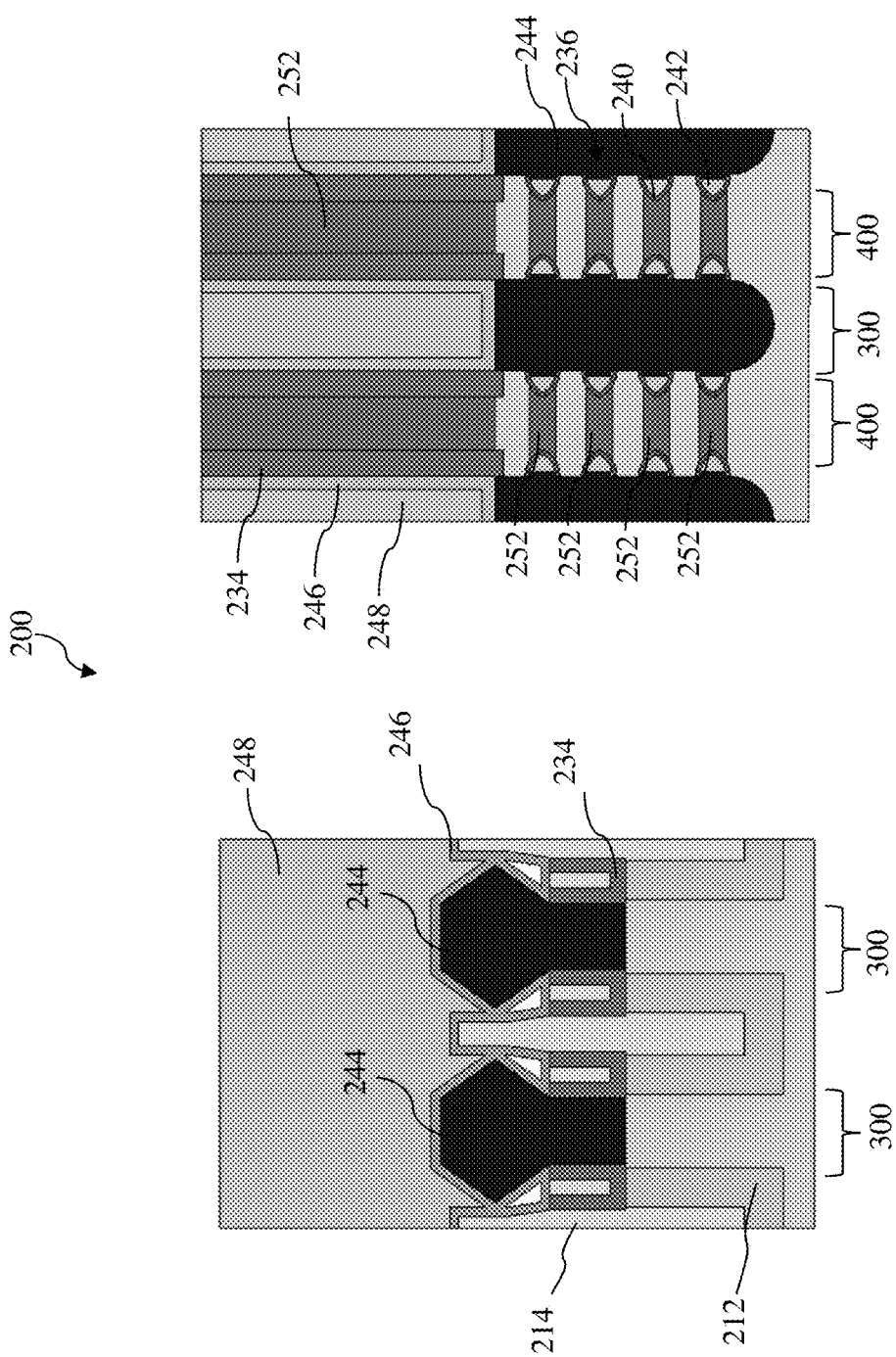

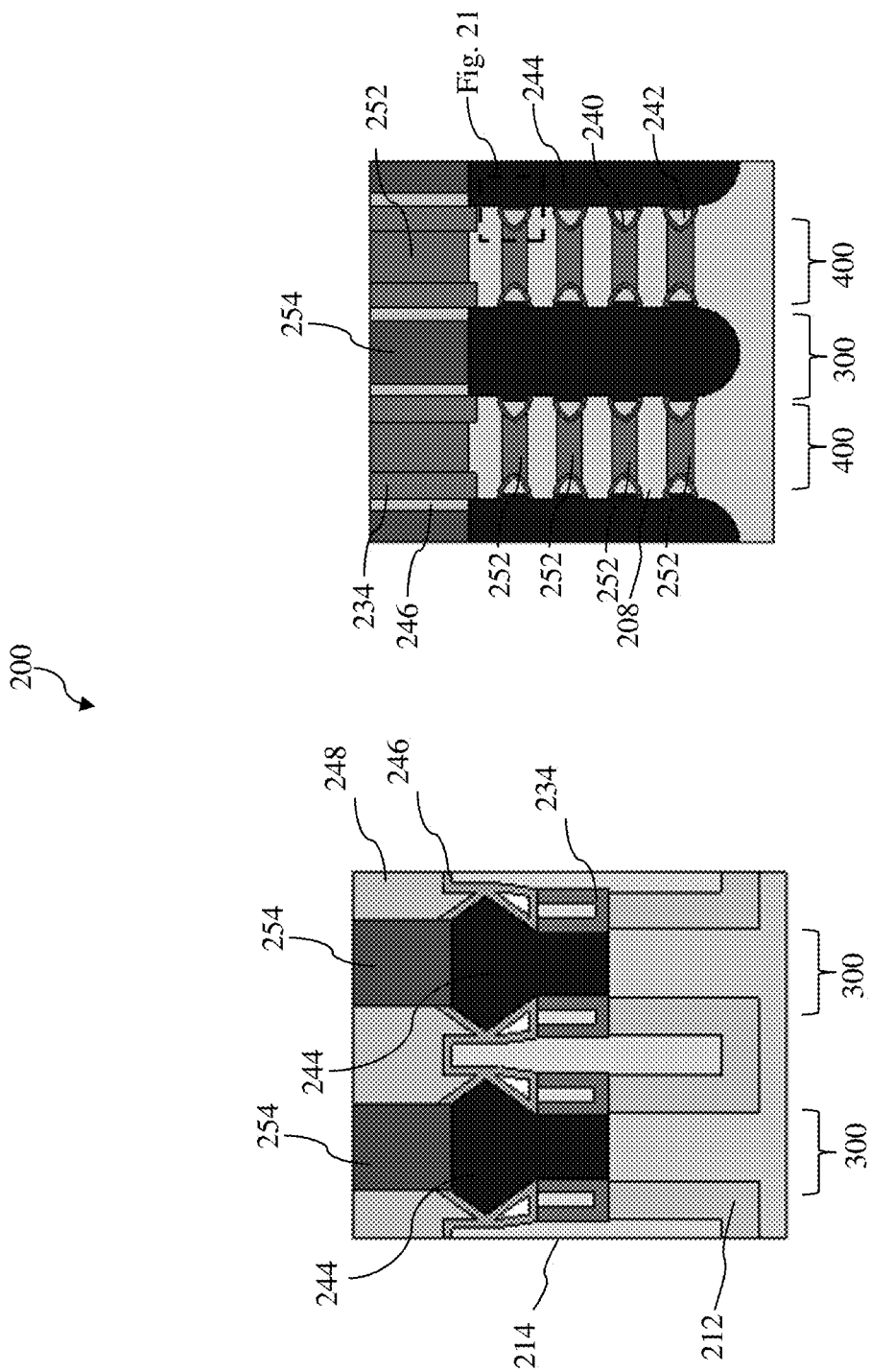

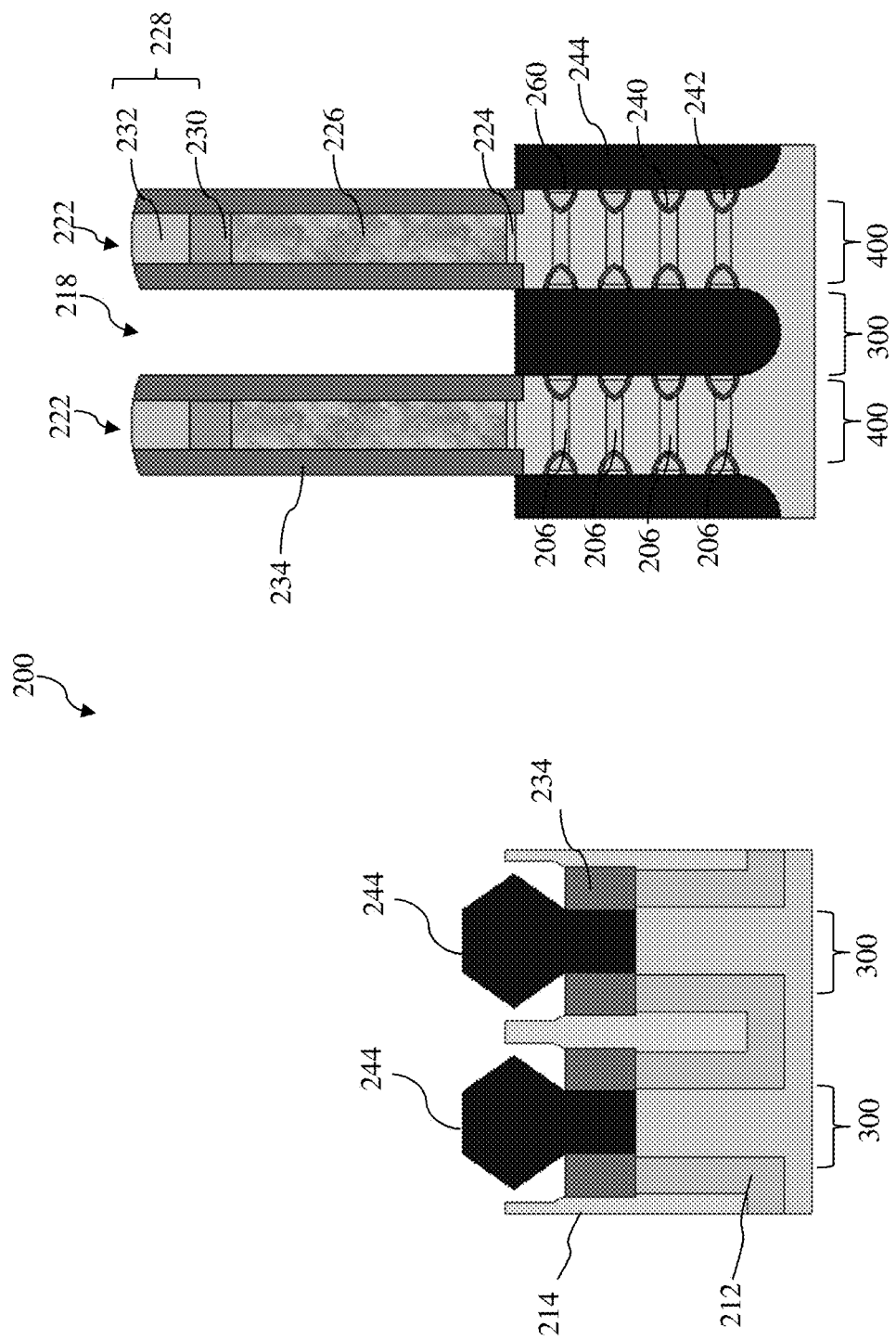

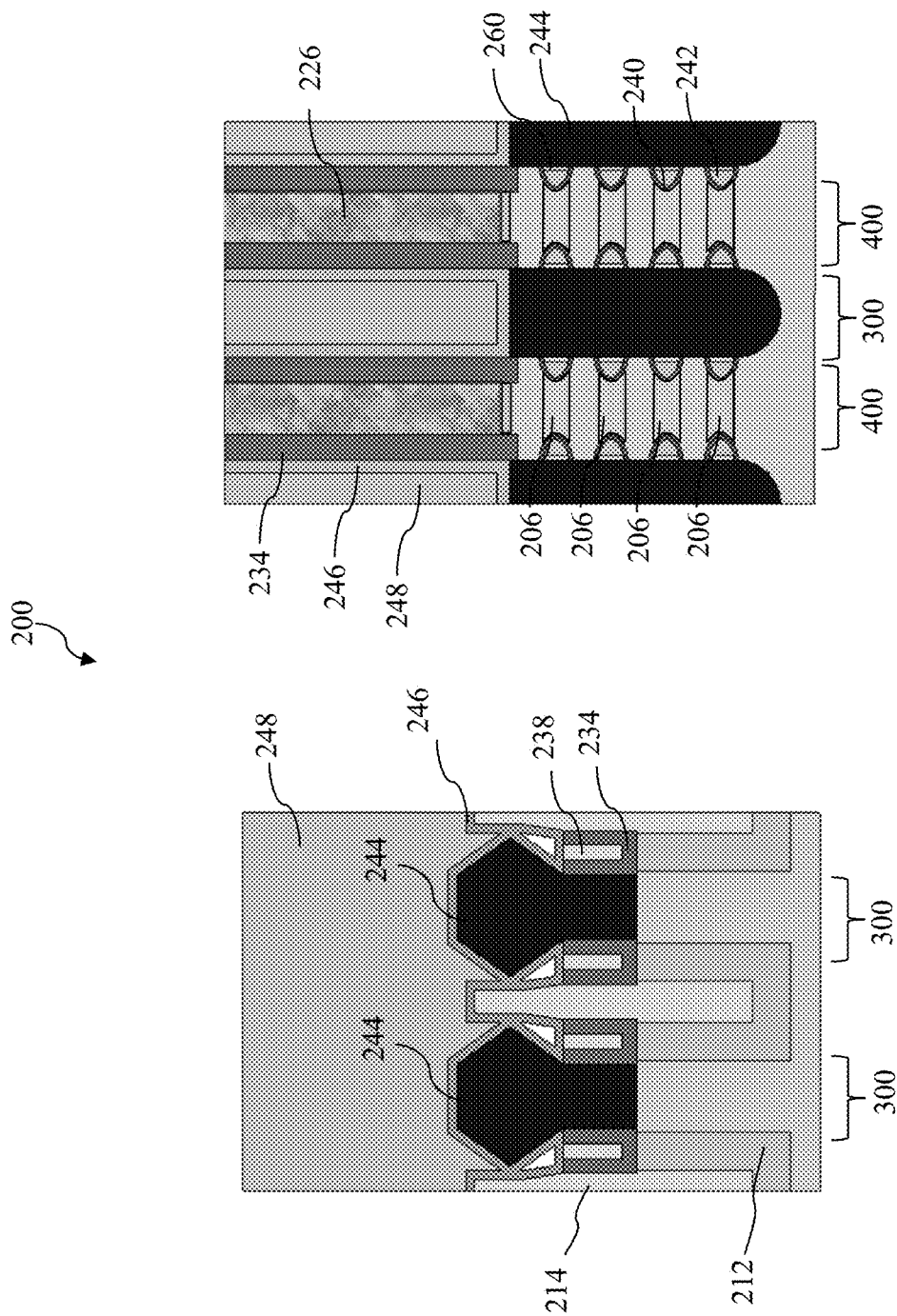

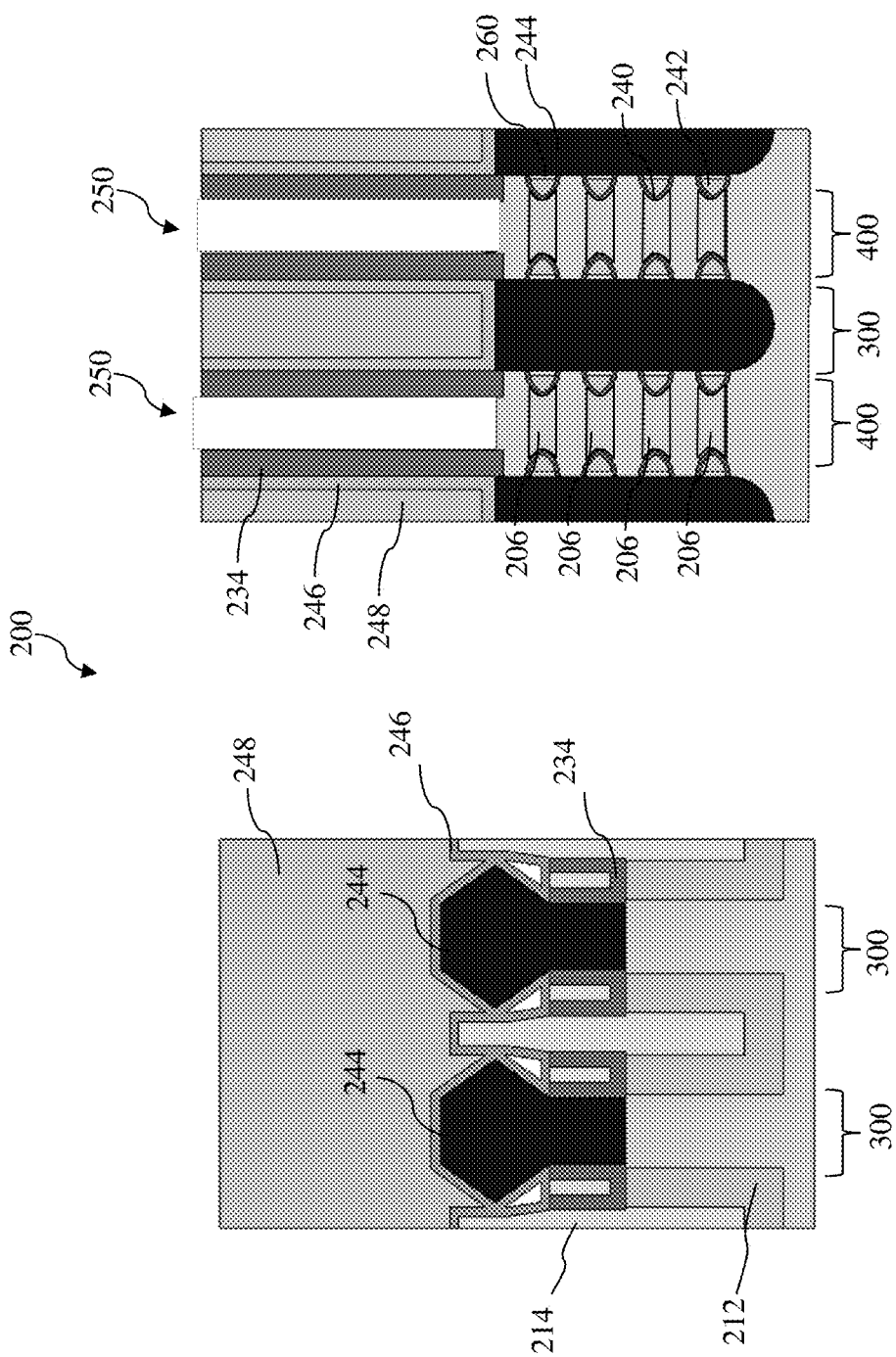

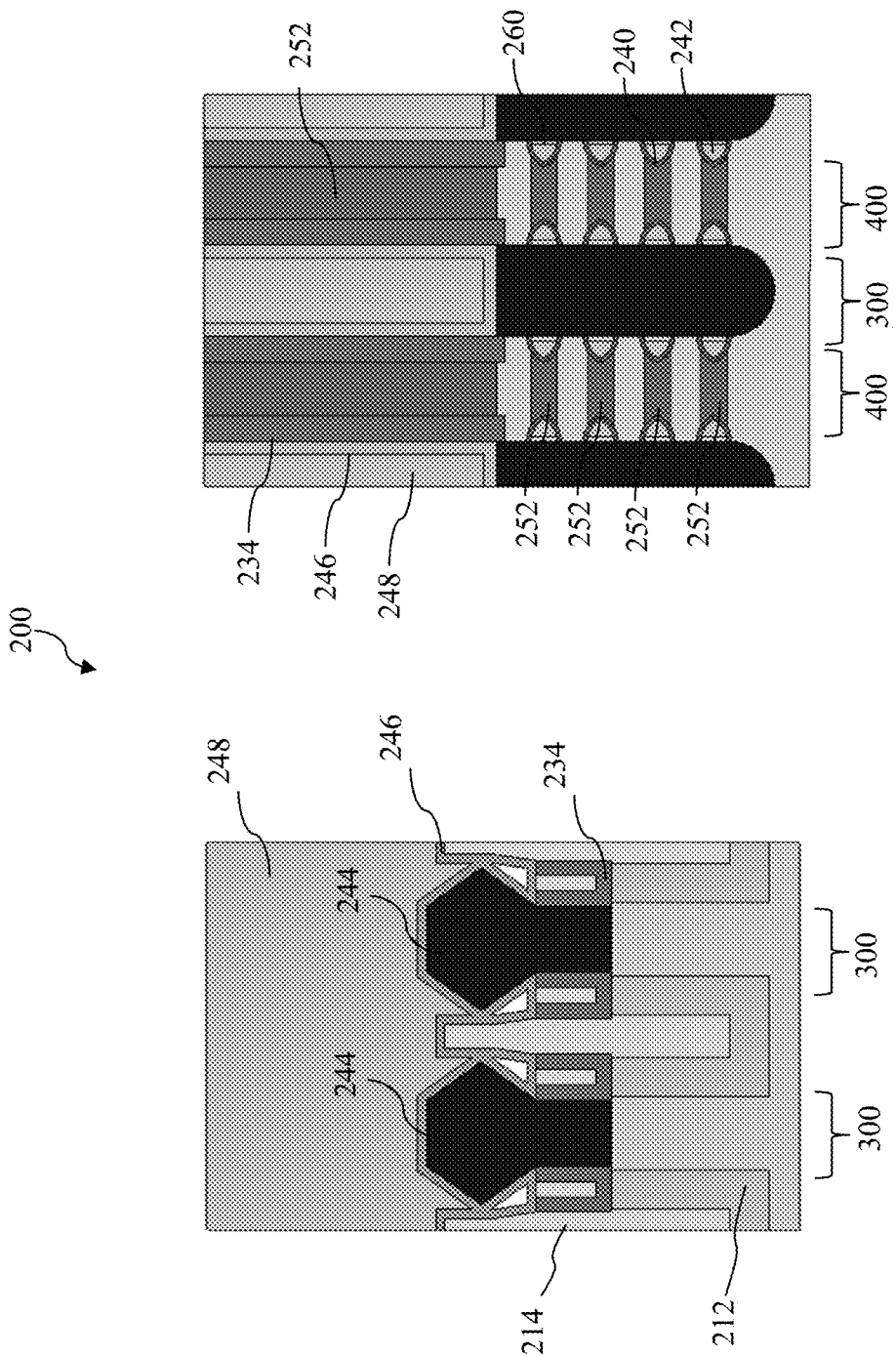

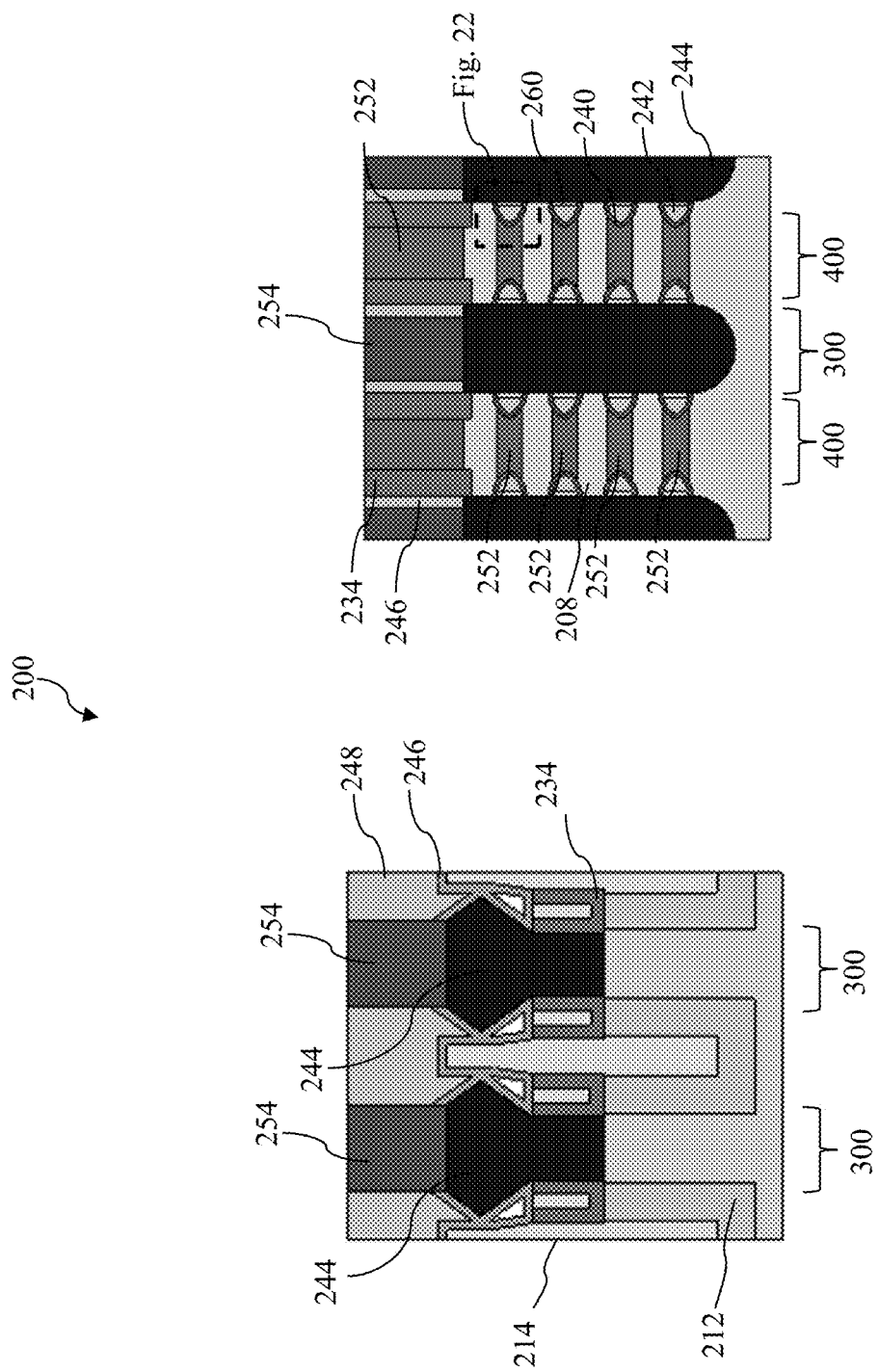

INNER SPACERS FOR GATE-ALL-AROUND TRANSISTORS

PRIORITY DATA

This application claims priority to U.S. Provisional Patent Application Ser. No. 62/853,954 filed on May 29, 2019, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanostructures (which extend horizontally, thereby providing horizontally-oriented channels) that are vertically stacked. Such GAA transistor can be referred to as a vertically-stacked horizontal GAA (VGAA) transistor.

In GAA devices, inner spacers have been used to reduce capacitance and leaking between gate structures and source/drain features. Although conventional GAA devices with inner spacers have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 3A, 3B, 4A, 4B, 5A, 5B, 6A, 6B, 7A, 7B, 8A, 8B, 9A-9G, 10A, 10B, 11A, 11B, 12A, 12B, 13A, 13B, 14A, 14B, 15A, 15B, 16A, 16B, 17A, 17B, 18A, 18B, 19A, 19B, 20A, and 20B illustrate cross-sectional views of a workpiece during a fabrication process according to the method of FIG. 1, according to one or more aspects of the present disclosure.

DETAILED DESCRIPTION

Figure 1:
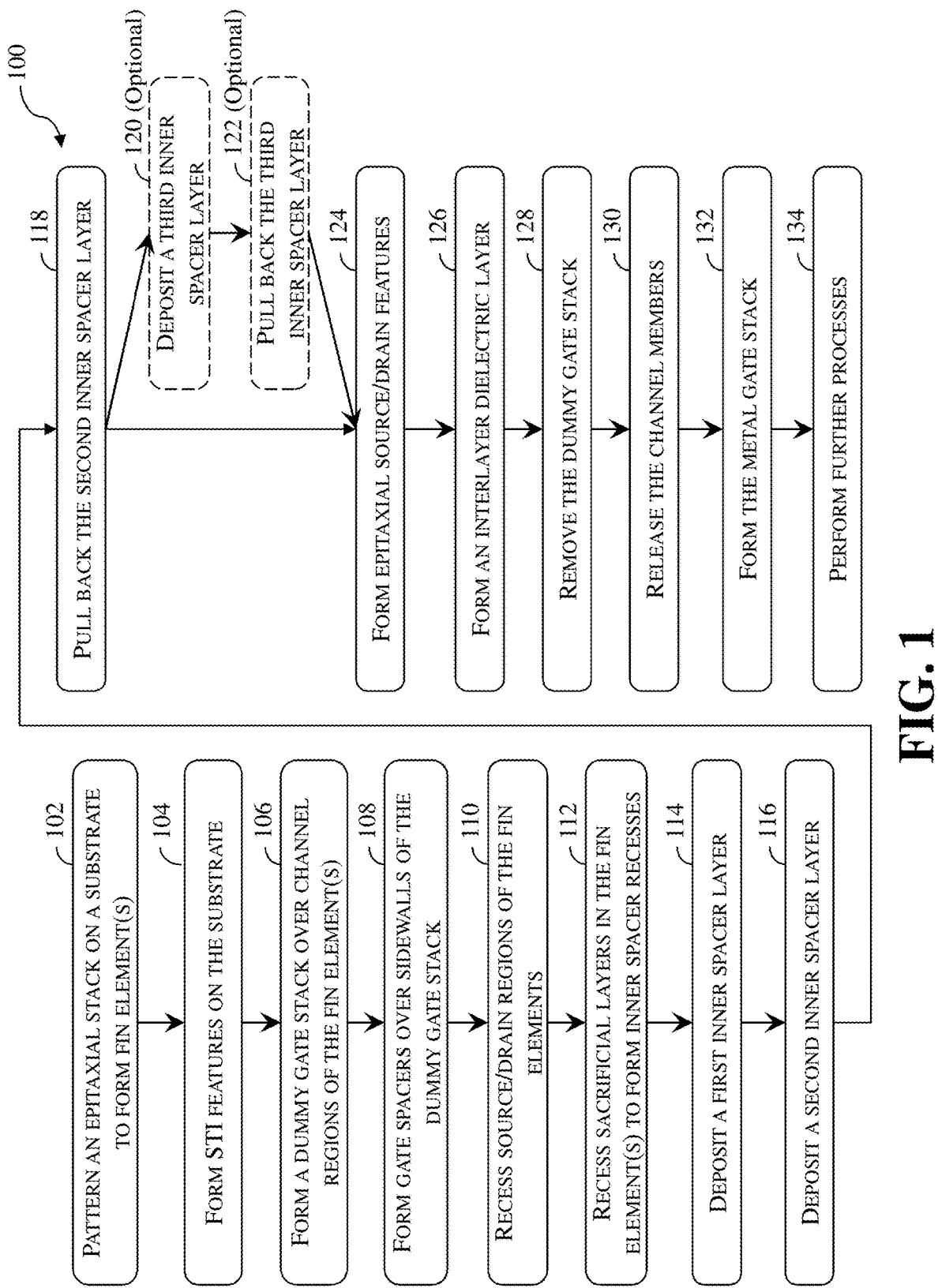
FIG. 1. Illustrates a flow chart of a method for forming a gate-all-around (GAA) device including inner spacer features, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to multi-gate transistors and fabrication methods, and more particularly to inner spacer formation when fabricating gate-all-around (GAA) transistors.

Multi-gate transistors include those transistors whose gate structures are formed on at least two-sides of a channel region. These multi-gate devices may include a p-type metal-oxide-semiconductor device or an n-type metal-oxide-semiconductor device. Examples of multi-gate transistors include FinFETs, on account of their fin-like structure and gate-all-around (GAA) devices. A GAA device includes any device that has its gate structure, or portion thereof, formed on 4-sides of a channel region (e.g., surrounding a portion of a channel region). Embodiments of the present disclosure may have channel regions disposed in nanowire channel(s), bar-shaped channel(s), nanosheet channel(s), nanostructure channel(s), column-shaped channel(s), post-shaped channel(s), and/or other suitable channel configurations. Devices according to the present disclosure may have one or more channel regions (e.g., nanowires, nanosheets, nanostructures) associated with a single, contiguous gate structure. However, one of ordinary skill would recognize that the teachings in the present disclosure may be applicable to a single channel (e.g., single nanowire, single nanosheet, single nanostructure) or any number of channels. One of ordinary skill in art may recognize other examples of semiconductor devices that may benefit from aspects of the present disclosure.

As scales of the fin width in FinFETs decreases, channel width variations could cause undesirable variability and mobility loss. GAA transistors are being studied as an alternative to FinFETs. In a GAA transistor, the gate of the transistor is made all around the channel such that the channel is surrounded or wrapped by the gate. Such a transistor has the advantage of improving the electrostatic control of the channel by the gate, which also mitigates leakage currents. A GAA transistor includes various spacers, such as inner spacers and gate spacers (also termed as outer spacers, top spacers or main spacers). Inner spacers serve to reduce capacitance and prevent leaking between gate structure and source/drain features. The integration of inner spacers in a GAA transistor is not without its challenges. For example, the formation of inner spacers and different types of source/drain features may include one or more etch back steps which may prevent low-k dielectric materials from being used in various spacers (such as poly spacers that are disposed over sidewalls of the fins) as additional defects may be induced in the one or more etch back processes. Such addition defects include gate spacer damages, gate-top hard mask loss, loss of shallow-trench isolation (STI), and inner spacer damages. The present disclosure provides embodiments of a multi-layer inner spacer feature that includes a first inner spacer and at least one additional inner spacer over the first inner spacer. The first inner spacer may serve as an etch stop layer (ESL) for the at least one additional spacer during the etch back operations for formation of source/drain features or inner spacers. The at least one additional inner spacer may include a second spacer that is formed of a low-k dielectric material to reduce parasitic capacitance and optionally a third spacer to further prevent defects from etch back operations.

Illustrated in FIG. 1 is a method 100 of forming a semiconductor device, such as a multi-gate device. As used herein, the term "multi-gate device" is used to describe a device (e.g., a semiconductor device) that has at least some gate material disposed on multiple sides of at least one channel of the device. In some examples, the multi-gate device may be referred to as a GAA device having gate material disposed on at least four sides of at least one channel of the device. The channel region may be referred to as a nanowire, nanosheet, nanostructure, channel member, semiconductor channel member, which as used herein includes channel regions of various geometries (e.g., cylindrical, bar-shaped, sheet-shaped) and various dimensions.

As with the other method embodiments and exemplary devices discussed herein, it is understood that parts of the workpiece 200 illustrated in FIGS. 2A, 2B, 3A, 3B, 4A, 4B, 5A, 5B, 6A, 6B, 7A, 7B, 8A, 8B, 9A-9G, 10A, 10B, 11A, 11B, 12A, 12B, 13A, 13B, 14A, 14B, 15A, 15B, 16A, 16B, 17A, 17B, 18A, 18B, 19A, 19B, 20A, and 20B may be fabricated by a CMOS technology process flow, and thus some processes are only briefly described herein. Upon conclusion of the fabrication process, the workpiece 200 will be turned into a semiconductor device 200. In that sense, the workpiece 200 and the semiconductor device 200 may be used interchangeably. Further, the exemplary semiconductor devices may include various other devices and features, such as other types of devices including additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including n-type GAA transistors, p-type GAA transistors, PFETs, NFETs, etc., which may be interconnected. Moreover, it is noted that the process steps of method 100, including any descriptions given with reference to FIGS. 2A, 2B, 3A, 3B, 4A, 4B, 5A, 5B, 6A, 6B, 7A, 7B, 8A, 8B, 9A-9G, 10A, 10B, 11A, 11B, 12A, 12B, 13A, 13B, 14A, 14B, 15A, 15B, 16A, 16B, 17A, 17B, 18A, 18B, 19A, 19B, 20A, and 20B, as with the remainder of the method and exemplary figures provided in this disclosure, are merely exemplary and are not intended to be limiting beyond what is specifically recited in the claims that follow.

A figure ending with A, such as FIG. 2A, 3A, 4A, 5A, 6A, 7A, 8A, 9A, 10A, 11A, 12A, 13A, 14A, 15A, 16A, 17A, 18A, 19A, or 20A, illustrates a fragmentary cross-sectional view across multiple source/drain region of the multiple fin elements (described below). A figure ending with B, such as FIG. 2B, 3B, 4B, 5B, 6B, 7B, 8B, 9B, 10B, 11B, 12B, 13B, 14B, 15B, 16B, 17B, 18B, 19B, or 20B, illustrates a fragmentary cross-sectional view along a fin element.

Referring to FIGS. 1, 2A and 2B, the method 100 includes block 102 where an epitaxial stack 204 on a substrate 202 is patterned to form fin elements 210. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type GAA transistors, p-type GAA transistors). The suitable doping may include ion implantation of dopants and/or diffusion processes. The substrate 202 may have isolation features interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features. In an embodiment of the method 100, an anti-punch through (APT) implant is performed. The APT implant may be performed in a region underlying the channel region of a device for example, to prevent punch-through or unwanted diffusion.

In some embodiments, the epitaxial stack 204 formed over the substrate 202 includes epitaxial layers 206 of a first composition interposed by epitaxial layers 208 of a second composition. The first and second composition can be different. In an embodiment, the epitaxial layers 206 are SiGe and the epitaxial layers 208 are silicon (Si). However, other embodiments are possible including those that provide for a first composition and a second composition having different oxidation rates and/or etch selectivity. In some embodiments, the epitaxial layers 206 include SiGe and the epitaxial layers 208 include Si.

It is noted that four (4) layers of the epitaxial layers 206 and four (4) layers of the epitaxial layers 208 are alternately arranged as illustrated in FIG. 2, which is for illustrative purposes only and not intended to be limiting beyond what is specifically recited in the claims. It can be appreciated that any number of epitaxial layers can be formed in the epitaxial stack 204. The number of layers depends on the desired number of channels members for the device 200. In some embodiments, the number of epitaxial layers 208 is between 2 and 10.

In some embodiments, each epitaxial layer 206 has a thickness ranging from about 2 nanometers (nm) to about 6 nm, such as 3 nm in a specific example. The epitaxial layers 206 may be substantially uniform in thickness. In some embodiments, each epitaxial layer 208 has a thickness ranging from about 6 nm to about 12 nm, such as 9 nm in a specific example. In some embodiments, the epitaxial layers 208 of the epitaxial stack 204 are substantially uniform in thickness. As described in more detail below, the epitaxial layers 208 or parts thereof may serve as channel member(s) for a subsequently-formed multi-gate device and the thickness is chosen based on device performance considerations. The epitaxial layers 206 in channel regions(s) may eventually be removed and serve to define a vertical distance between adjacent channel region(s) for a subsequently-formed multi-gate device and the thickness is chosen based on device performance considerations. Accordingly, the epitaxial layers 206 may also be referred to as sacrificial layers 206, and epitaxial layers 208 may also be referred to as channel layers 208.

By way of example, epitaxial growth of the layers of the epitaxial stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 208 include the same material as the substrate 202. In some embodiments, the epitaxially grown layers 206 and 208 include a different material than the substrate 202. As stated above, in at least some examples, the epitaxial layers 206 include an epitaxially grown silicon germanium (SiGe) layer and the epitaxial layers 208 include an epitaxially grown silicon (Si) layer. Alternatively, in some embodiments, either of the epitaxial layers 206 and 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206 and 208 may be chosen based on providing differing oxidation, etching selectivity properties. In some embodiments, the epitaxial layers 206 and 208 are substantially dopant-free (i.e., having an extrinsic dopant concentration from about 0 $cm^{-3}$ to about $1\times10^{17}$ $cm^{-3}$), where for example, no intentional doping is performed during the epitaxial growth process.

At block 102, the epitaxial stack 204 over the substrate 202 is patterned to form the fin elements 210 that extend from the substrate 202. In some embodiments, the patterning also etches into the substrate 202 such that each of the fin elements 210 includes a lower portion formed from the substrate 202 and an upper portion from the epitaxial stack 204. The upper portion includes each of the epitaxial layers of the epitaxial stack 204 including epitaxial layers 206 and 208. The fin elements 210 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin elements 210 by etching the epitaxial stack 204. The etching process can include dry etching, wet etching, reactive ion etching (RIE), and/or other suitable processes.

Referring still to FIGS. 1 and 2A, method 100 includes a block 104 where shallow trench isolation (STI) feature 212 is formed. By way of example, in some embodiments, a dielectric layer is first deposited over the substrate 202, filling the trenches 216 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. The deposited dielectric material is then thinned and planarized, for example by a chemical mechanical polishing (CMP) process. The planarized dielectric layer is further recessed by a dry etching process, a wet etching process, and/or a combination thereof to form the STI features 212. The fin elements 210 rise above the STI features 212. In some embodiments, the dielectric layer (and the subsequently formed STI features 212) may include a multi-layer structure, for example, having one or more liner layers.

In some embodiments presented in FIG. 2A, dielectric fins 214 are also formed at block 104 of method 100. In those embodiments, after the dielectric material is deposited to form the dielectric layer, the dielectric layer is patterned to form slits that extend in parallel with the fin elements 210. Material for the dielectric fins 214 is then deposited over the workpiece 200 to fill the slits. The material for the dielectric fins 214 is different from the dielectric material that forms the STI features 212. That allows the dielectric layer for the STI features 212 to be selectively etched when the dielectric layer is recessed, leaving behind the dielectric fins 214 that also rise above the STI features 212. In some embodiments, the material for the dielectric fins 214 may include silicon nitride, silicon carbonitride, silicon carbide, aluminum oxide, zirconium oxide, or other suitable materials. As shown in FIG. 2A, the dielectric fins 214 interpose between the fin elements 210 and serve to separate source/drain features of neighboring devices. The dielectric fins 214 may also be referred to as dummy fins 214 or hybrid fins 214. In some alternative embodiments, an upper portion of the dielectric fins 214 may be removed during a gate cut process and replaced by a dielectric material that may be different or similar to that of the dielectric fins.

Referring to FIGS. 1 and 3B, the method 100 includes a block 106 where a dummy gate stack 222 is formed over a channel region 400 of the fin element 210. In some embodiments, a gate replacement or gate-last process is adopted that the dummy gate stack 222 serves as a placeholder for a high-k metal gate stack and is to be remove and replaced by the high-k metal gate stack. Other processes and configuration are possible. In some embodiments, the dummy gate stack 222 is formed over the substrate 202 and is at least partially disposed over the fin elements 210. The portion of the fin elements 210 underlying the dummy gate stack 222 is the channel region 400. The dummy gate stack 222 may also define a source/drain (S/D) region 300 adjacent to and on opposing sides of the channel region 400. It is noted that the channel region 400 is not visible in FIG. 3A.

In the illustrated embodiment, block 106 first forms a dummy dielectric layer 224 over the fin elements 210. In some embodiments, the dummy dielectric layer 224 may include silicon oxide, silicon nitride, a high-K dielectric material and/or other suitable material. In various examples, the dummy dielectric layer 224 may be deposited by a CVD process, a subatmospheric CVD (SACVD) process, a flowable CVD process, an ALD process, a PVD process, or other suitable process. By way of example, the dummy dielectric layer 224 may be used to prevent damages to the fin elements 210 by subsequent processes (e.g., subsequent formation of the dummy gate stack). Subsequently, block 106 forms other portions of the dummy gate stack 222, including a dummy electrode layer 226 and a hard mask 228 which may include multiple layers 230 and 232. In some embodiments, the dummy gate stack 222 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy electrode layer 226 may include polycrystalline silicon (polysilicon). In some embodiments, the hard mask 228 includes an oxide layer 230 such as a pad oxide layer that may include silicon oxide. In some embodiments, hard mask 228 includes the nitride layer 232 such as a pad nitride layer that may include silicon nitride, silicon oxynitride and/or silicon carbide.

Still referring to FIG. 3B, in some embodiments, after formation of the dummy gate stack 222, the dummy dielectric layer 224 is removed from the source/drain regions 300 of the fin elements 210. That is the dummy dielectric layer 224 that is not covered by the dummy electrode layer 226 is removed. The removal process may include a wet etch, a dry etch, and/or a combination thereof. The etch process is chosen to selectively etch the dummy dielectric layer 224 without substantially etching the fin elements 210, the hard mask 228, and the dummy electrode layer 226.

Figures 4A, 4B:
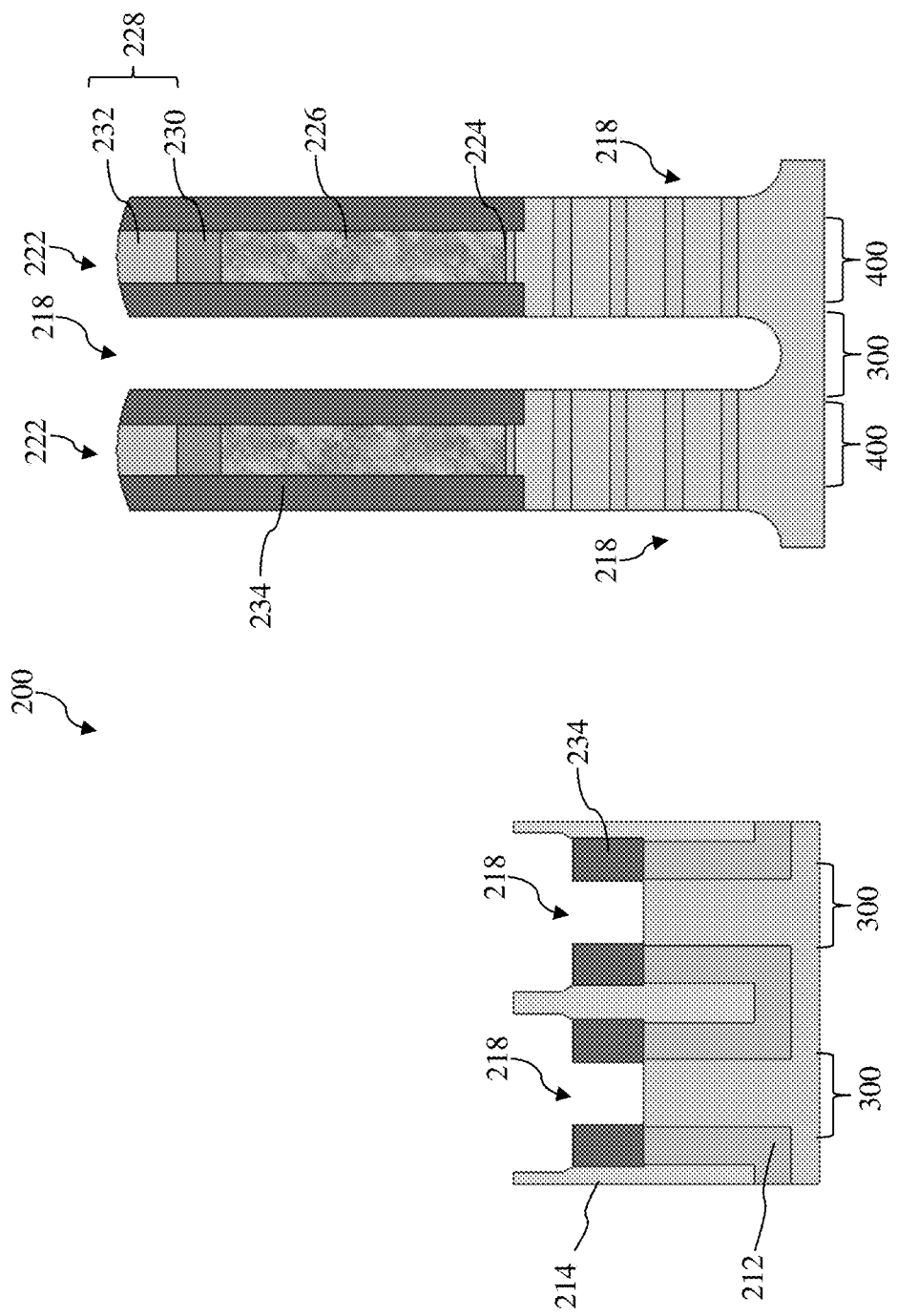

Referring to FIGS. 1, 4A and 4B, the method 100 includes a block 108 where gate spacers are formed over sidewalls of the dummy gate stack 222. In some embodiments, spacer material for forming the gate spacers is deposited conformally over the workpiece 200, including over top surfaces and sidewalls of the dummy gate stack 222, to form a spacer material layer. The term "conformally" may be used herein for ease of description of a layer having substantially uniform thickness over various regions. The spacer material may include a dielectric material such as silicon oxide, silicon nitride, silicon carbide, silicon oxynitride, silicon carbonitride, silicon oxycarbide, silicon oxycarbonitrde, and/or combinations thereof. In some embodiments, the spacer material layer includes multiple layers, such as main spacer walls, liner layers, and the like. The spacer material may be deposited over the dummy gate stack 222 using processes such as, CVD process, a subatmospheric CVD (SACVD) process, a flowable CVD process, an ALD process, a PVD process, or other suitable process. The spacer material layer is then etched back in an anisotropic etch process to form the gate spacers 234. The anisotropic etch process exposes portions of the fin elements 210 adjacent to and not covered by the dummy gate stack 222 (e.g., in source/drain regions). Portions of the spacer material layer directly above the dummy gate stack 222 may be completely removed by this anisotropic etching process while the gate spacers 234 remain on sidewalls of the dummy gate stack 222.

Referring to FIGS. 1, 4A and 4B, the method 100 includes a block 110 where source/drain regions 300 of the fin elements 210 are recessed. In some embodiments, the portions of the fin elements 210 that are not covered by the dummy gate stack 222 and the gate spacers 234 are etched by a dry etch or a suitable etching process to form source/drain trench 218. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some embodiments represented in FIGS. 4A and 4B, the upper portion of the fin element 210 is recessed to expose the sacrificial layers 206 and the channel layers 208. In some implementations, at least a portion of the lower portion of the fin elements 210 are recessed as well. That is, the source/drain trench 218 may extend below the bottom-most sacrificial layer 206. Upon conclusion of operations in block 110, the source/drain regions 300 of the fin elements 210 may become level with to or lower than the top surface of the STI features 212.

Referring to FIGS. 1 and 5B, the method 100 includes a block 112 where the sacrificial layers 206 in the fin elements 210 are recessed. In some embodiments represented in FIG. 5B, the sacrificial layers 206 exposed in the source/drain trench 218 are selectively and partially recessed to form inner spacer recesses 236 while the exposed channel layers 208 are substantially unetched. In an embodiment where the channel layers 208 consist essentially of Si and sacrificial layers 206 consist essentially of SiGe, the selective recess of the sacrificial layers 206 may include a SiGe oxidation process followed by a SiGe oxide removal. In those embodiments, the SiGe oxidation process may include use of ozone. In some embodiments, the selective recess may be a selective isotropic etching process (e.g., a selective dry etching process or a selective wet etching process), and the extent the sacrificial layers 206 are recessed is controlled by duration of the etching process. In some embodiments, the selective wet etching process may include a hydro fluoride (HF) or NH4OH etchant. As shown in FIG. 5B, the inner spacer recesses 236 extend inward from the source/drain trench 218.

Referring to FIGS. 1, 6A and 6B, the method 100 includes a block 114 where a first inner spacer layer 240 is deposited. In some embodiments, the first inner spacer layer 240 may be deposited by CVD, PECVD, LPCVD, ALD or other suitable method. In some instances, the first inner spacer layer 240 is formed to a thickness between about 1 nm and about 3 nm. The first inner spacer layer 240 functions to protect the gate spacers 234, the hard mask 228, and the channel layers 208 from damages during pull back (etch back) of inner spacers. In some implementations, the first inner spacer layer 240 may be formed of metal oxides or carbon-rich silicon carbonitride. The metal oxides here may include aluminum oxide, zirconium oxide, tantalum oxide, yttrium oxide, titanium oxide, lanthanum oxide, or other suitable metal oxide. The carbon-rich silicon carbonitride may include a carbon content greater than 5%. In embodiments represented in FIGS. 6A and 6B, the first inner spacer layer 240 may be deposited conformally over the top surface of the hard mask 228, top surfaces and sidewalls of the gate spacers 234, portions of the substrate 202 exposed in the source/drain trench 218, top surface and sidewalls of the dielectric fins 214.

Figures 7A, 7B:
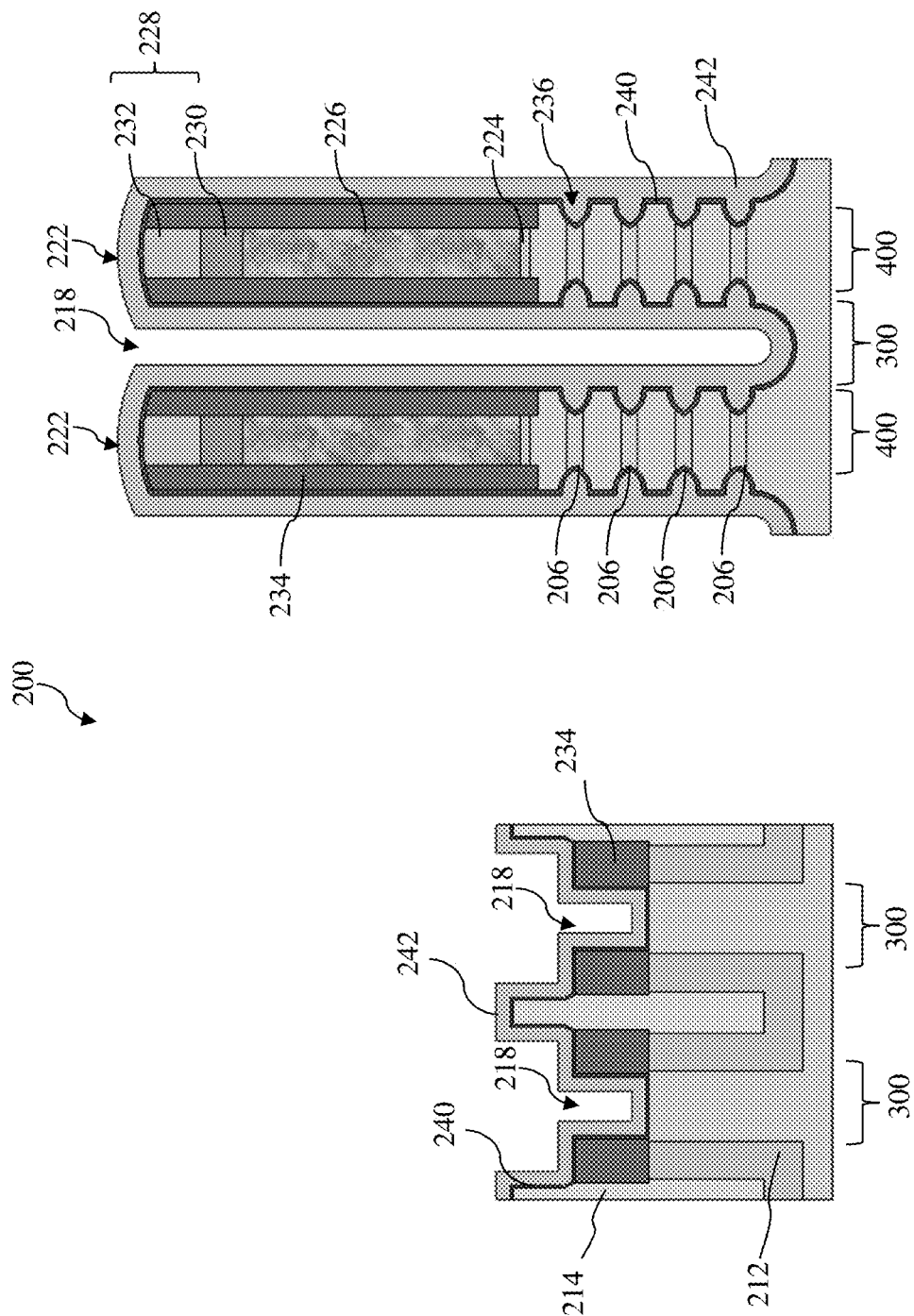

Referring to FIGS. 1, 7A and 7B, the method 100 includes a block 116 where a second inner spacer layer 242 is deposited. In some embodiments, the second inner spacer layer 242 may be deposited by CVD, PECVD, LPCVD, ALD or other suitable method. In some instances, the second inner spacer layer 242 may be formed to a thickness between about 3 nm and about 5 nm. Because the inner spacer recesses 236 are not filled by the first inner spacer layer 240, the second inner spacer layer 242 is also deposited into the inner spacer recesses 236. The thickness of the second inner spacer layer 242 in the inner spacer recesses 236 may be between about 5 nm and about 20 nm. In some implementations, the second inner spacer layer 242 may be formed of silicon oxide, silicon oxycarbonitride, silicon oxycarbide, or other low-k material. The second inner spacer layer 242 may be porous to further reduce the dielectric constant. In some instances, the carbon content of the second inner spacer layer 242 is smaller than the carbon content of the first inner spacer layer 240. In embodiments represented in FIGS. 7A and 7B, the second inner spacer layer 242 may be deposited conformally over the first inner spacer layer 240.

Referring to FIGS. 1, 8A and 8B, the method 100 includes a block 118 where the second inner spacer layer 242 is pulled back. In some embodiments, the second inner spacer layer 242 is isotropically and selectively etched back until the second inner spacer layer 242 is completely removed from the top surfaces of the hard mask 228, top surfaces and sidewalls of the gate spacers 234, portions of the substrate 202 exposed in the source/drain trench 218, and top surfaces and sidewalls of the dielectric fins 214. As described above, the composition of the first inner spacer layer 240 is different from the composition of the second inner spacer layer 242 such that the second inner spacer layer 242 may be selectively etched while the first inner spacer layer 240 experiences a slow etch rate. In some implementations, at block 118, the etch selectivity of the second inner spacer layer 242 to the first inner spacer layer 240 is greater than 5. In some implementations, the isotropic etch performed at block 118 may include use of hydrogen fluoride, fluorine gas, hydrogen, ammonia, nitrogen trifluoride, or other fluorine-based etchants. In some embodiments represented in FIGS. 8A and 8B, the second inner spacer layer 242 in the inner spacer recesses 236 is etched such that an outer surface of the second inner spacer layer 242 is not coplanar with the sidewalls of the gate spacers 234.

Referring to FIGS. 1, 9A and 9B, the method 100 includes a block 124 where epitaxial source/drain features 244 are formed. During the epitaxial growth process, the dummy gate stack 222 and gate spacers 234 limit the epitaxial source/drain features 244 to the source/drain regions 300 of the fin elements 210. In some instances, the dielectric fins 214 may serve to prevent epitaxial source/drain features 244 formed from different fin elements 210 from touching one another. In alternative embodiments where the dielectric fins 214 are not present, the epitaxial source/drain features 244 of adjacent fin elements 210 may be allowed to merge if such merger does not cause failure of the semiconductor device. Suitable epitaxial processes include CVD deposition techniques (e.g., vapor-phase epitaxy (VPE) and/or ultra-high vacuum CVD (UHV-CVD)), molecular beam epitaxy (MBE), and/or other suitable processes. The epitaxial growth process may use gaseous and/or liquid precursors, which interact with the composition of the substrate 202 as well as the channel layers 208. In the embodiments represented in FIG. 9B, the epitaxial source/drain features 244 are in direct contact with the channel layers 208 and the portions of the substrate 202 exposed in the source/drain trench 218. In those embodiments, the epitaxial source/drain features 244 are not in direct contact with the sacrificial layers 206. Instead, the epitaxial source/drain features 244 are in direct contact with the first inner spacer layer 240 and the second inner spacer layer 242 deposited in the inner spacer recesses 236.

In various embodiments, the epitaxial source/drain features 244 may include Ge, Si, GaAs, AlGaAs, SiGe, GaAsP, SiP, or other suitable material. The epitaxial source/drain features 244 may be in-situ doped during the epitaxial process by introducing doping species including: p-type dopants, such as boron or $BF_2$; n-type dopants, such as phosphorus or arsenic; and/or other suitable dopants including combinations thereof. If the epitaxial source/drain features 244 are not in-situ doped, an implantation process (i.e., a junction implant process) is performed to dope the epitaxial source/drain features 244. In an exemplary embodiment, the epitaxial source/drain features 244 in an NMOS device include SiP, while those in a PMOS device include SiGeB. In some implementations, epitaxial source/drain features 244 for NMOS and PMOS devices are formed separately to have different epitaxial source/drain features 244 for NMOS and PMOS devices. An example process is shown in FIGS. 9C-9G. After the second inner spacer layer 242 is pulled back at block 118, a pattern film 302 is deposited to cover both the PMOS device region 2000 and the NMOS device region 1000. A photoresist layer 304 is deposited and patterned to expose the pattern film 302 over the NMOS device region 1000, allowing the exposed pattern film 302 to be removed. The patterned photoresist layer 304 is then removed from the PMOS device region 2000. The removal of the pattern photoresist layer may also remove the first inner spacer layer 240 (on the top surface of the hard mask 228, top surfaces and sidewalls of the gate spacers 234, portions of the substrate 202 exposed in the source/drain trench 218, top surface and sidewalls of the dielectric fins 214) over the PMOS device region 2000. With the PMOS device region 2000 masked by the pattern film 302, operations at block 124 are performed to the NMOS device region to form n-type epitaxial source/drain features 244N. Thereafter, similar techniques may be used to form p-type epitaxial source/drain features 244P. A different pattern film 302' is formed and patterned to mask the NMOS device region 1000 and then operations at block 124 are performed to the PMOS device region 2000 to form p-type epitaxial features 244P. The order of forming the epitaxial source/drain features 244 may be reversed and p-type epitaxial source/drain features 244P for the PMOS device region 2000 may be formed first. In instances where the first inner spacer layer 240 (on the top surface of the hard mask 228, top surfaces and sidewalls of the gate spacers 234, over surfaces of the dielectric fins 214) is not removed during the formation of the epitaxial source/drain features 244, a wet clean process may be performed to remove the first inner spacer layer 240 (on the top surface of the hard mask 228, sidewalls of the gate spacers 234, over surfaces of the dielectric fins 214). In some embodiments, the wet clean process may include use of SPM (sulfuric acid and hydrogen peroxide mixture) solution, SC-1 (RCA Standard Clean-1) solution, or SC-2 (RCA Standard Clean-2) solution. In embodiments represented in FIGS. 9A and 9B, the first inner spacer layer 240 is only present in the inner spacer recesses 236.

Furthermore, silicidation or germano-silicidation may be formed on the epitaxial source/drain features 244. For example, silicidation, such as nickel silicide, titanium silicide, tantalum silicide, or tungsten silicide, may be formed by depositing a metal layer over the epitaxial source/drain features 244 and annealing the metal layer such that the metal layer reacts with silicon in the epitaxial source/drain features 244 to form the metal silicidation. The unreacted metal layer may be removed.

Figures 10A, 10B:
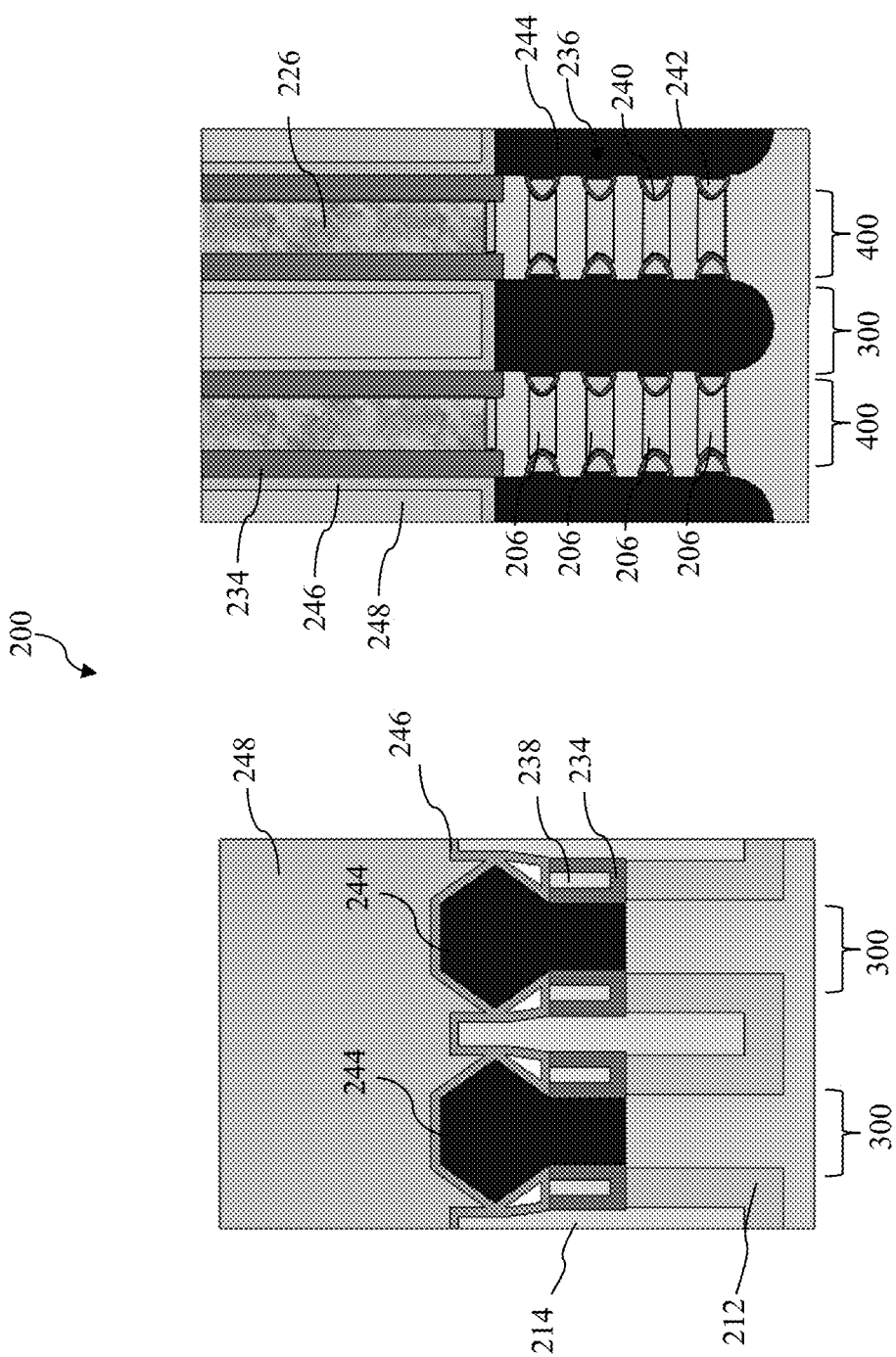

Referring to FIGS. 1, 10A and 10B, the method 100 includes a block 126 where an interlayer dielectric (ILD) layer 248 is formed. In some embodiments, a contact etch stop layer (CESL) 246 is formed prior to forming the ILD layer 248. In some examples, the CESL 246 includes a silicon nitride layer, a silicon oxide layer, a silicon oxynitride layer, and/or other materials known in the art. The CESL 246 may be formed by ALD, plasma-enhanced chemical vapor deposition (PECVD) process and/or other suitable deposition or oxidation processes. In some embodiments, the ILD layer 248 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 248 may be deposited by a PECVD process or other suitable deposition technique. In some embodiments, after formation of the ILD layer 248, the workpiece 200 may be annealed to improve integrity of the ILD layer 248.

In some examples, after depositing the ILD layer 248, a planarization process may be performed to remove excessive dielectric materials. For example, a planarization process includes a chemical mechanical planarization (CMP) process which removes portions of the ILD layer 248 (and CESL 246, if present) overlying the dummy gate stack 222 and planarizes a top surface of the workpiece 200. In some embodiments, the CMP process also removes hard mask 228 and exposes the dummy electrode layer 226, as shown in FIGS. 10A and 10B.

In some instances, the gate spacers 234 are formed along sidewalls of the dummy gate stack 222 and sidewalls of the dielectric fins 214 and may have gaps defined by the gate spacers 234. The gaps may be filled by a dielectric feature 238 shown in FIG. 10A. The dielectric feature 238 may be formed of silicon oxide, silicon nitride, silicon carbide, silicon oxynitride, silicon carbonitride, silicon oxycarbide, silicon oxycarbonitride, and/or combinations thereof. In some implementations, the dielectric feature 238 may include one or more of dielectric material that is deposited after the gaps are formed. For example, the first inner spacer layer 240, the second inner spacer layer 242, the third inner spacer layer 260 (described below, shown in FIGS. 14B and 15B) and contact etch stop layer (CESL) 246 may be deposited into the gaps and partially or completely fill the gaps, forming all of part of the dielectric feature 238.

Figures 11A, 11B:
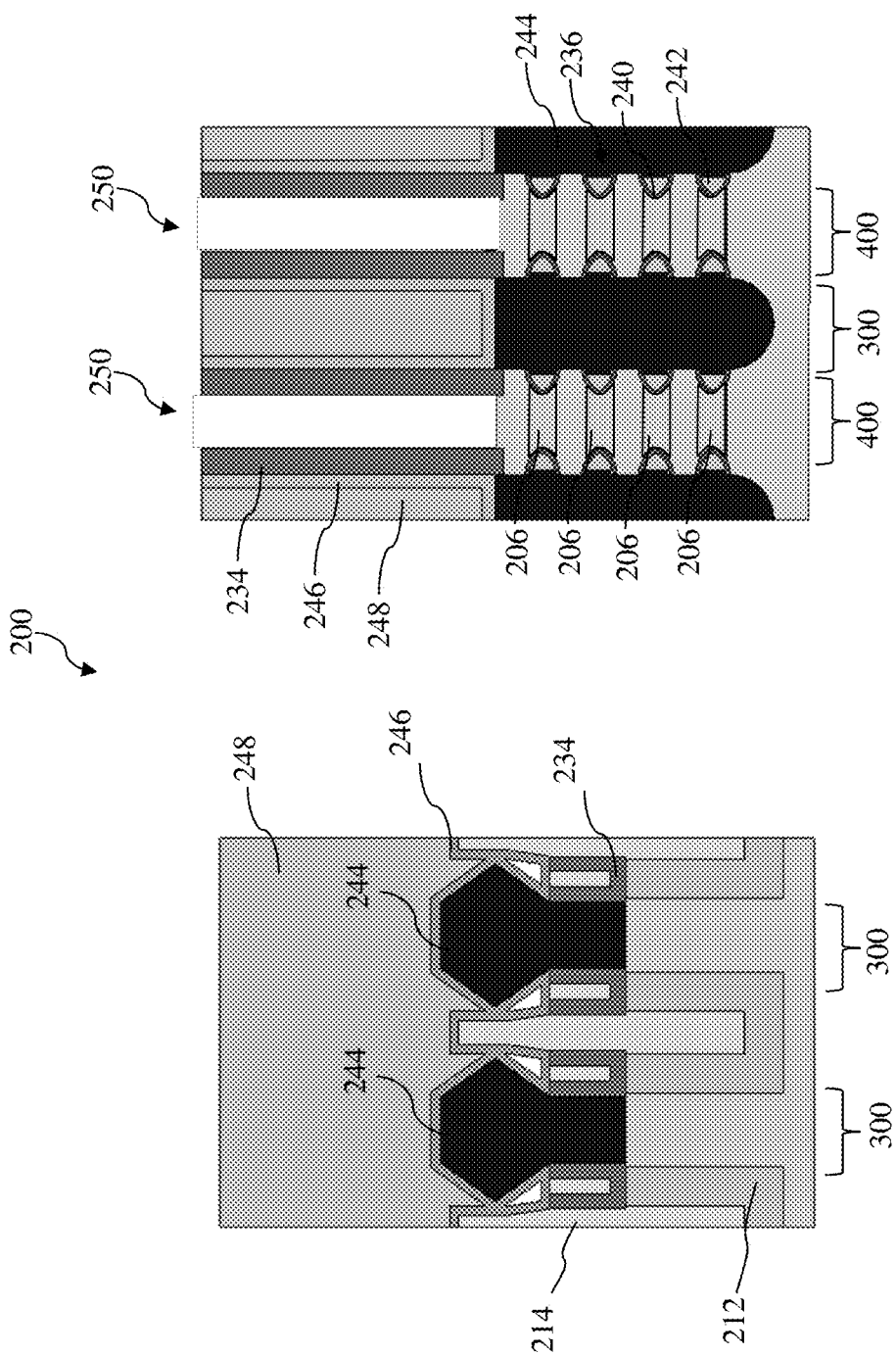

Referring to FIGS. 1, 11A and 11B, the method 100 includes a block 128 where the dummy gate stack 222 is removed. In some embodiments, the removal of the dummy gate stacks 222 results in gate trenches 250 over the channel regions 400. A final high-k gate structure (e.g., including a high-K dielectric layer and metal gate electrode) may be subsequently formed in the gate trench 250, as will be described below. Block 128 may include one or more etching processes that are selective to the material in the dummy gate stack 222. For example, the removal of the dummy gate stack 222 may be performed using as a selective wet etch, a selective dry etch, or a combination thereof that is selective to the dummy electrode layer 226. The epitaxial layers 206 and 208 of the fin 210 are exposed in the gate trench 250.

Referring to FIGS. 1, 11A and 11B, the method 100 includes a block 130 where the channel members 208 are released. Operations of block 130 remove the sacrificial layers 206 between first inner spacer layers 240 and the channel layers 208 in the channel regions 400 are vertically spaced apart by the thickness of each of the sacrificial layer 206. The selective removal of the sacrificial layers 206 releases the channel layers 208 to be channel members 208. It is noted that the same reference numeral 208 is used to denote channel members 208 for simplicity. Block 130 may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a silicon germanium oxide removal. For example, the oxidation may be provided by ozone clean and then silicon germanium oxide removed by an etchant such as $NH_4OH$.

Referring to FIGS. 1, 12A and 12B, the method 100 includes a block 132 where the metal gate stack 252 is formed. The metal gate stack 252 may be a high-K metal gate stack, however other compositions are possible. In some embodiments, the metal gate stack 252 is formed within the gate trenches 250 over the workpiece 200 and is deposited in the space left behind by the removal of the sacrificial layers 206. In this regard, the metal gate stack 252 wraps around each of the channel members 208 in each of the fin elements 210. In various embodiments, the metal gate stack 252 (or high-K metal gate stack 252) includes an interfacial layer, a high-K gate dielectric layer formed over the interfacial layer, and/or a gate electrode layer formed over the high-K gate dielectric layer. High-K gate dielectrics, as used and described herein, include dielectric materials having a high dielectric constant, for example, greater than that of thermal silicon oxide (~3.9). The gate electrode layer used within the metal gate stack 252 may include a metal, metal alloy, or metal silicide. Additionally, the formation of the metal gate stack 252 may include depositions to form various gate materials, one or more liner layers, and one or more CMP processes to remove excessive gate materials and thereby planarize a top surface of the workpiece 200.

In some embodiments, the interfacial layer of the metal gate stack 252 may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer of the metal gate stack 252 may include a high-K dielectric layer such as hafnium oxide. Alternatively, the high-K gate dielectric layer of the metal gate stack 252 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods.

The gate electrode layer of the metal gate stack 252 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer of metal gate stack 252 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer of the metal gate stack 252 may be formed by ALD, PVD, CVD, e-beam evaporation, or other suitable process. Further, the gate electrode layer may be formed separately for N-FET and P-FET transistors which may use different metal layers (e.g., for providing different N-type and P-type work function metal layers). In various embodiments, a CMP process may be performed to remove excessive metal from the gate electrode layer of the metal gate stack 252, and thereby provide a substantially planar top surface of the metal gate stack 252. The metal gate stack 252 includes portions that interpose between channel members 208 in the channel regions 400.

Referring to FIGS. 1, 13A and 13B, the method 100 includes a block 134 where further processes are performed. The workpiece 200 may undergo further processes to form the semiconductor device 200. Such further processes may include, for example, formation of source/drain contacts 254. In this example, openings for the source/drain contacts 254 are formed through the ILD layer 248 and a metal fill layer is formed in the openings. In some implementations, a barrier layer or a liner may be formed between the epitaxial source/drain features 244 and the source/drain contacts 254. The source/drain contacts 254 and the gate contacts (not shown) allow the GAA transistors formed in method 100 to be electrically coupled to a multilayer interconnect structure that includes multiple contact vias and metal line layers in one or more intermetal dielectric layers. The multilayer interconnect structure is configured to connect various multi-gate devices, memory devices, input/output devices, power-gate devices, passive devices, and other devices to form a functional circuit.

Figures 14A, 14B:
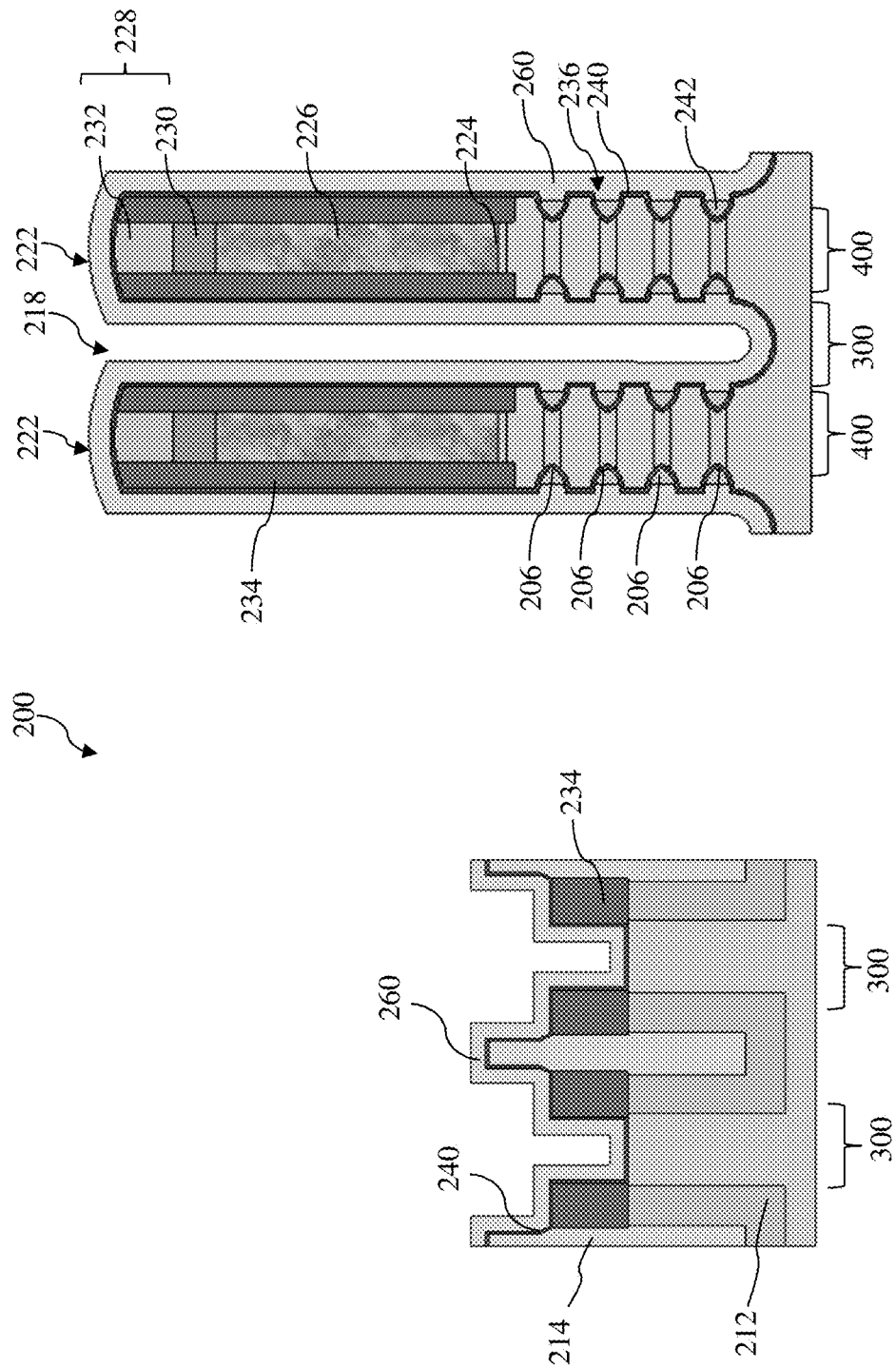

Reference is now made to FIGS. 14A, 14B, 15A, 15B, 16A, 16B, 17A, 17B, 18A, 18B, 19A, 19B, 20A, and 20B. In some alternative embodiments, the method 100 may include optional operations in blocks 120 and 122 to integrate a third inner spacer layer 260. Referring to FIGS. 1, 14A and 14B, method 100 may optionally include a block 120 where a third inner spacer layer 260 is deposited over the workpiece 200 after block 118 is completed. That is, the third inner spacer layer 260 is deposited over the pulled-back second inner spacer layer 242. In some implementations, the deposition method and the material of the third inner spacer layer 260 may be substantially similar to those of the first inner spacer layer 240. Like the first inner spacer layer 240, the third inner spacer layer 260 may be formed of metal oxides or silicon carbonitrides with carbon content greater than 5%. The third inner spacer layer 260 functions to protect the low-k second inner spacer layer 242. It has been observed that low-k dielectric materials tend to etch faster than high-k dielectric materials. In embodiments of the present disclosure, the first inner spacer layer 240 and the third inner spacer layer 260 have dielectric constants that are greater than the dielectric constant of the second inner spacer layer 242.

Figure 15B:
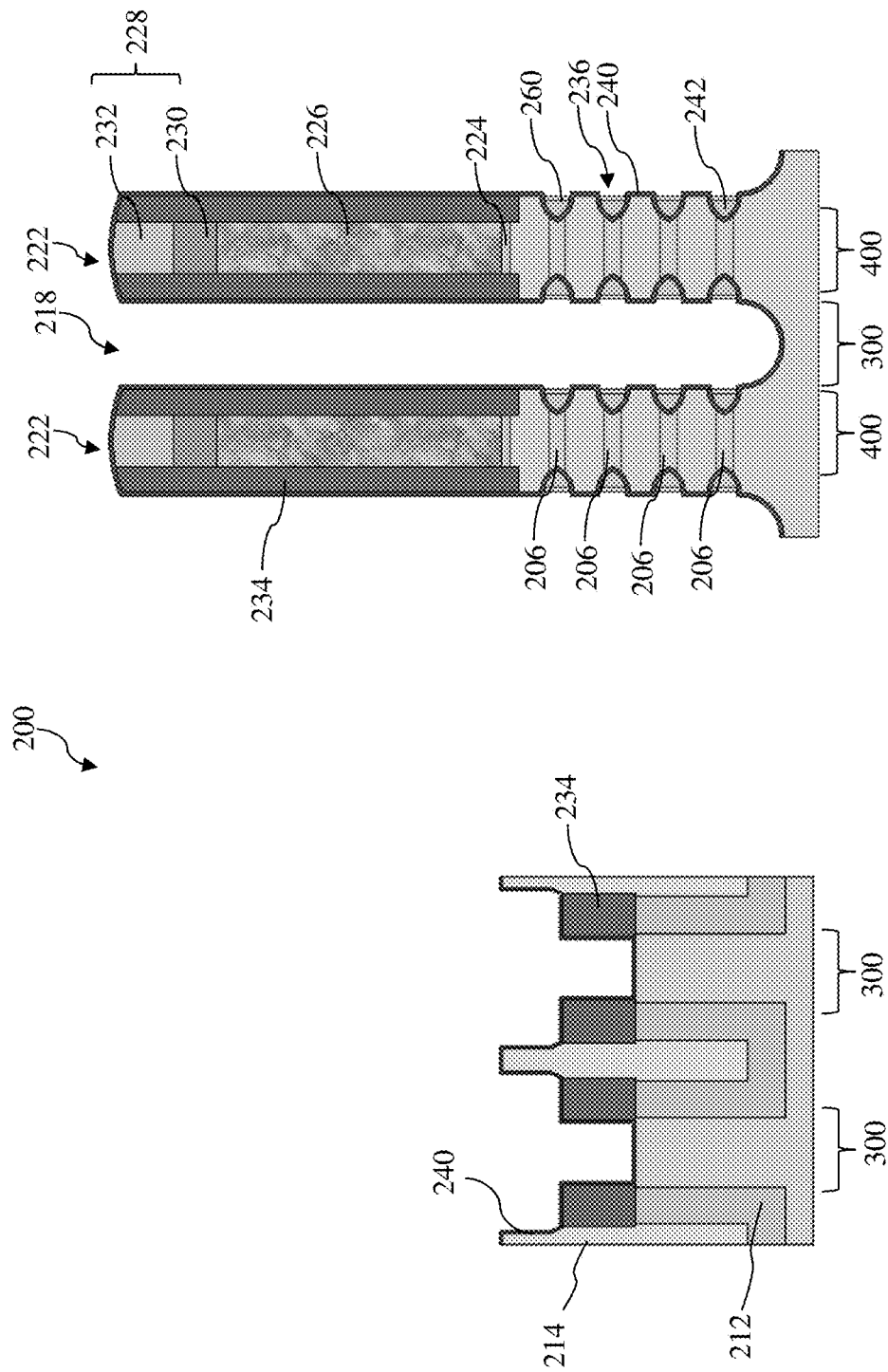
Figure 15A:
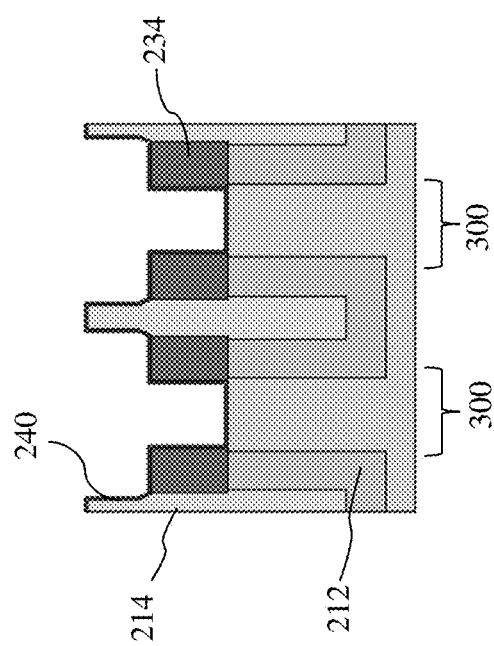

Referring to FIGS. 1, 15A, and 15B, the method 100 may optionally include a block 122 where the third inner spacer layer 260 is pulled back. In some embodiments, the third inner spacer layer 260 is isotropically etched back until the third inner spacer layer 260 is completely removed from the top surfaces of the dummy gate stack 222, top surfaces and sidewalls of the gate spacers 234, and top surfaces and sidewalls of the dielectric fins 214. In some implementations, the isotropic etch performed at block 122 may include use of hydrogen fluoride, fluorine gas, hydrogen, ammonia, nitrogen trifluoride, or other fluorine-based etchants. In some other implementations, the isotropic etch performed at block 122 may include a wet clean process, which includes use of SPM (sulfuric acid and hydrogen peroxide mixture) solution, SC-1 (RCA Standard Clean-1) solution, or SC-2 (RCA Standard Clean-2) solution.

As illustrated in FIGS. 16A, 16B, 17A, 17B, 18A, 18B, 19A, 19B, 20A, and 20B, operations after completion of block 122 bear resemblance to blocks 124, 126, 128, 130, 132, and 134 described above in association with embodiments where the third inner spacer layer 260 is absent. Details of these operations will be omitted and succinct descriptions of these figures will be provided for brevity. FIGS. 16A and 16B illustrate that the first inner spacer layer 240 over the hard mask 228, gate spacers 234, and the dielectric fins 214 is removed, either along with a photoresist layer during epitaxial source/drain feature 244 formation or in a wet clean process. FIGS. 17A and 17B illustrate that the workpiece 200 is planarized to expose the dummy electrode layer 226 ahead of the removal of the dummy gate stack 222. In FIGS. 18A and 18B, the dummy gate stack 222 is removed, exposing the sacrificial layers 206 and channel layers 208 in the gate trenches 250 over the channel regions 400. In FIGS. 19A and 19B, the sacrificial layers 206 in the gate trenches 250 are selectively removed to release the channel layers 208 as channel members 208. In addition, metal gate stack 252 is deposited layer by layer to wrap around the released channel members 208 in the channel regions 400. In FIGS. 20A and 20B, the workpiece 200 is planarized and source/drain contacts 254 are formed to connect the GAA transistors to a multilayer interconnect structure (not shown).

Figures 21, 22:
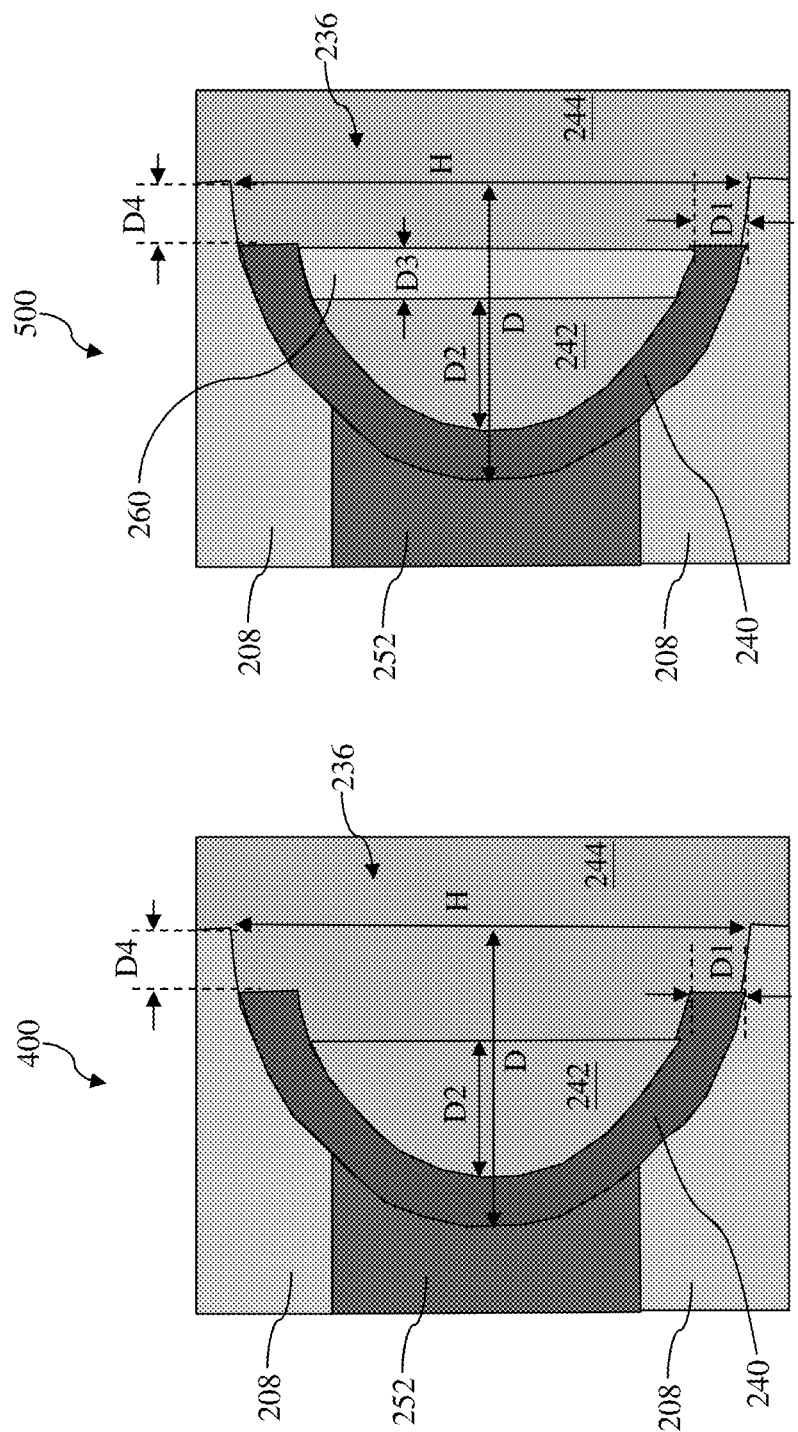
FIGS. 21 and 22 illustrate enlarged cross-sectional views of inner spacer features, according to one or more aspects of the present disclosure.

Depending on whether or not there is a third inner spacer layer 260, the configurations of the inner spacer layers in or around the inner spacer recesses 236 are different. An enlarged view of the dotted rectangular region in FIG. 13B is illustrated in FIG. 21. Reference is now made to FIG. 21. The inner spacer recess 236 may have a lateral depth D between about 5 nm and about 20 nm and an opening height H between about 5 nm and about 20 nm. The first inner spacer layer 240 may have a first thickness D1 between about 1 nm and about 3 nm. The second inner spacer layer 242 may have a second depth (measured from the first inner spacer layer 240) D2 between about 2 nm and about 15 nm. A fourth depth D4 between the outer edges of the first inner spacer layer 240 and the sidewall of the channel layer 208 may be between about 0 nm and 3 nm. That is, in some instances, the outer edges of the first inner spacer layer 240 and the sidewall of the channel layer 208 may be coplanar. The first inner spacer layer 240 and the second inner spacer layer 242 in FIG. 21 may be viewed collectively as a first dielectric feature 400. The first inner spacer 240 of the first dielectric feature 400 is curved and wraps around the second inner spacer layer 242. As illustrated in FIG. 21, two adjacent channel members 208 are separated in part by the first dielectric feature 400. In other words, the first dielectric feature 400 is sandwiched between two adjacent channel members 208. In embodiments represented in FIG. 21, the portion of the metal gate stack 252 between two adjacent channel members 208 is in direct contact with the first inner spacer layer 240. The second inner spacer layer 242 of the first dielectric feature 400 is spaced apart from the portion of the metal gate stack 252 between two adjacent channel members 208. The low-k second inner spacer layer 242 is disposed between the portion of the metal gate stack 252 (between two adjacent channel members 208) and the epitaxial source/drain feature 244 to reduce parasitic capacitance. The thicknesses of the first inner spacer layer 240 and the second inner spacer layer 242 in the first dielectric feature 400 are selected such that the first inner spacer layer 240 may function as an etch stop layer and the thickness of the second inner spacer layer 242 is maximized for purposes of lowering capacitance.

Similarly, an enlarged view of the dotted rectangular region in FIG. 20B is illustrated in FIG. 22. In embodiments where the third inner spacer layer 260 is implemented, the third inner spacer layer 260 may have a third thickness D3 between about 1 nm and 3 nm. The other characteristic dimensions, such as D, D1, D2, D4, and H, in FIG. 22 may be similar to those shown in FIG. 21 and their descriptions will not be repeated. The first inner spacer layer 240, the second inner spacer layer 242 and the third inner spacer layer 260 in FIG. 22 may be viewed collectively as a second dielectric feature 500. The inner inner spacer 240 of the second dielectric feature 500 is curved and wraps around the second inner spacer layer 242 and the third inner spacer layer 260. As illustrated in FIG. 22, two adjacent channel members 208 are separated in part by the second dielectric feature 500. In other words, the second dielectric feature 500 is sandwiched between two adjacent channel members 208. In embodiments represented in FIG. 22, the portion of the metal gate stack 252 between two adjacent channel members 208 is in direct contact with the first inner spacer layer 240. The second inner spacer layer 242 and the third inner spacer layer 260 of the second dielectric feature 500 is spaced apart from the portion of the metal gate stack 252 between two adjacent channel members. The low-k second inner spacer layer 242 is disposed between the portion of the metal gate stack 252 (between two adjacent channel members 208) and the epitaxial source/drain feature 244 to reduce parasitic capacitance. The thicknesses of the first inner spacer layer 240, the second inner spacer layer 242, and the third inner spacer layer 260 in the second dielectric feature 500 are selected such that the first inner spacer layer 240 may function as an etch stop layer, and the thickness of the second inner spacer layer 242 is maximized for purposes of lowering capacitance, and the third inner spacer layer 260 adequately protects the second inner spacer layer 242.

Although not intended to be limiting, one or more embodiments of the present disclosure provide many benefits to a semiconductor device and the formation thereof. For example, embodiments of the present disclosure provide multilayer inner spacer layers to protect the hard mask, gate spacers, channel layers, and to integrate low-k dielectric material. In some embodiments, a first inner spacer layer is deposited to serve as an etch stop layer while a second inner spacer layer is deposited to import low-k dielectric materials. In other embodiments, a third inner spacer layer is deposited to protect the low-k second inner spacer layer. Furthermore, the multilayer inner spacer layers formation method can be easily integrated into existing semiconductor fabrication processes.

In one exemplary aspect, the present disclosure is directed to a semiconductor device. The semiconductor device includes a first semiconductor channel member and a second semiconductor channel member over the first semiconductor channel member, and a dielectric feature including a first dielectric layer and a second dielectric layer different from the first dielectric layer. The dielectric feature is sandwiched between the first and second semiconductor channel members.

In some embodiments, the first dielectric layer wraps around the second dielectric layer. In some embodiments, the first dielectric layer is in contact with the first and second semiconductor channel members. In some embodiments, the second dielectric layer is spaced apart from the first and second semiconductor channel members by the first dielectric layer. In some implementations, the semiconductor device further includes a metal gate stack that wraps around the first and second semiconductor channel members and a portion of the metal gate stack is in contact with the dielectric feature. In some embodiments, wherein the second dielectric layer is spaced apart from the metal gate stack by the first dielectric layer. In some implementations, the semiconductor device further includes a source/drain feature and, the first dielectric layer and the second dielectric layer of the dielectric feature are in contact with the source/drain feature. In some instances, the dielectric feature further includes a third dielectric layer disposed between the source/drain feature and the second dielectric layer of the dielectric feature.

In another exemplary aspect, the present disclosure is directed to a semiconductor device. The semiconductor device includes a first semiconductor channel member and a second semiconductor channel member over the first semiconductor channel member, and a first dielectric feature and a second dielectric feature disposed between the first semiconductor channel member and the second semiconductor channel member. Each of the first dielectric feature and the second dielectric feature includes a first dielectric layer wrapping around a second dielectric layer. In some embodiments, a dielectric constant of the first dielectric layer is greater than a dielectric constant of the second dielectric layer. In some embodiments, the first dielectric layer includes silicon oxynitride, silicon carbonitride, silicon oxycarbide, or silicon oxycarbonitride and the second dielectric layer includes porous silicon oxycarbonitride or silicon oxide. In some implementations, the semiconductor device further includes a metal gate stack that wraps around the first and second semiconductor channel members and a portion of the metal gate stack extends between the first dielectric feature and the second dielectric feature. In some implementations, the second dielectric layers of the first and second dielectric features are spaced apart from the metal gate stack by the first dielectric layers. In some instances, each of the first and second dielectric features further includes a third dielectric layer and the first dielectric layer and the third dielectric layer collectively wrap completely around the second dielectric layer.

In yet another exemplary aspect, the present disclosure is directed to a method of fabricating a semiconductor device. The method of fabricating a semiconductor device includes providing a fin structure that includes a plurality of first semiconductor layers interleaved by a plurality of second semiconductor layers, forming a dummy gate structure over a channel region of the fin structure, recessing a source/drain region of the fin structure, the source/drain region being adjacent to the channel region, selectively and partially recessing the plurality of second semiconductor layers to form a plurality of recesses, forming a first inner spacer layer over the plurality of recesses, and forming a second inner spacer layer over the first inner spacer layer. A composition of the first inner spacer layer is different from a composition of the second inner spacer layer.

In some embodiments, the method further includes selectively recessing the second inner spacer layer. In some embodiments, the selectively recessing the second inner spacer layer removes the second inner spacer layer not disposed in the plurality of recesses. In some implementations, the method further includes forming a third inner spacer layer over the second inner spacer layer and selectively recessing the third inner spacer layer. In some instances, the first inner spacer layer and the third inner spacer layer includes silicon oxynitride, silicon carbonitride, silicon oxycarbide, or silicon oxycarbonitride, and the second inner spacer layer includes porous silicon oxycarbonitride or silicon oxide. In some embodiments, a carbon content of the first inner spacer layer or the third inner spacer layer is greater than a carbon content of the second inner spacer layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first source/drain feature and a second source/drain feature;
   a first semiconductor channel member and a second semiconductor channel member over the first semiconductor channel member, the first semiconductor channel member and the second semiconductor channel member extending between the first source/drain feature and the second source/drain feature along a first direction;
   a first hybrid fin and a second hybrid fin extending lengthwise along the first direction;
   a metal gate stack that wraps around each of the first and second semiconductor channel members; and
   a dielectric feature comprising a first dielectric layer, a second dielectric layer different from the first dielectric layer, and a third dielectric layer,
   wherein the dielectric feature is sandwiched between the first and second semiconductor channel members,
   wherein a dielectric constant of the first dielectric layer is greater than a dielectric constant of the second dielectric layer,
   wherein a dielectric constant of the third dielectric layer is greater than the dielectric constant of the second dielectric layer,
   wherein bottom surfaces of the first source/drain feature and the second source/drain feature are lower than a bottom surface of the metal gate stack,
   wherein the first source/drain feature is disposed between the first hybrid fin and the second hybrid fin along a second direction perpendicular to the first direction.

2. The semiconductor device of claim 1, wherein the first dielectric layer and the third dielectric layer collectively wrap around the second dielectric layer.

3. The semiconductor device of claim 1, wherein the first dielectric layer is in contact with the first and second semiconductor channel members.

4. The semiconductor device of claim 1, wherein the second dielectric layer is spaced apart from the first and second semiconductor channel members by the first dielectric layer.

5. The semiconductor device of claim 1,
   wherein a portion of the metal gate stack is in contact with the dielectric feature.

6. The semiconductor device of claim 5, wherein the second dielectric layer is spaced apart from the metal gate stack by the first dielectric layer.

7. The semiconductor device of claim 1, wherein the first dielectric layer and the third dielectric layer of the dielectric feature are in contact with the first source/drain feature.

8. The semiconductor device of claim 7, wherein a composition of the third dielectric layer and a composition of the first dielectric layer are the same.

9. A semiconductor device, comprising:
   a first source/drain feature and a second source/drain feature;
   a first semiconductor channel member and a second semiconductor channel member over the first semiconductor channel member, the first semiconductor channel member and the second semiconductor channel member extending between the first source/drain feature and the second source/drain feature along a first direction;
   a first dielectric fin and a second dielectric fin extending along the first direction; and
   a first dielectric feature and a second dielectric feature disposed between the first semiconductor channel member and the second semiconductor channel member,
   wherein each of the first dielectric feature and the second dielectric feature comprises a first dielectric layer, a second dielectric layer and a third dielectric layer,
   wherein the first dielectric layer and the third dielectric layer collectively wrap around the second dielectric layer,
   wherein the second dielectric layer is porous,
   wherein the first source/drain feature is disposed between the first dielectric fin and the second dielectric fin along a second direction perpendicular to the first direction.

10. The semiconductor device of claim 9,
    wherein the first dielectric layer comprises silicon oxynitride, silicon carbonitride, silicon oxycarbide, or silicon oxycarbonitride,
    wherein the second dielectric layer comprises porous silicon oxycarbonitride or silicon oxide.

11. The semiconductor device of claim 9, further comprising a metal gate stack that wraps around the first and second semiconductor channel members,
    wherein a portion of the metal gate stack extends between the first dielectric feature and the second dielectric feature.

12. The semiconductor device of claim 11, wherein the second dielectric layers of the first and second dielectric features are spaced apart from the metal gate stack by the first dielectric layers.

13. The semiconductor device of claim 9,
wherein the first dielectric layer, the second dielectric layer and the third dielectric layer comprise carbon,
wherein a carbon content of the first dielectric layer or a carbon content of the third dielectric layer is greater than a carbon content of the second dielectric layer.

14. The semiconductor device of claim 9, wherein the second dielectric layer is porous.

15. A semiconductor structure, comprising:
a substrate;
a plurality of nanostructures over the substrate and extending lengthwise along a first direction;
a first dielectric fin and a second dielectric fin extending lengthwise along the first direction;
a source/drain feature coupled to the plurality of nanostructures and extending into the substrate; and
a plurality of inner spacer features interleaving the plurality of nanostructures and disposed between a bottommost nanostructure of the plurality of nanostructures and the substrate,
wherein each of the plurality of inner spacer features comprises a first dielectric layer, a second dielectric layer and a third dielectric layer,
wherein the second dielectric layer is spaced apart from the plurality of nanostructures or the substrate by the first dielectric layer,
wherein the second dielectric layer is spaced apart from the source/drain feature by the first dielectric layer and the third dielectric layer,
wherein the plurality of nanostructure are vertically stacked one over another,
wherein a portion of the source/drain feature horizontally extends between two adjacent nanostructures of the plurality of nanostructures,
wherein the source/drain feature is disposed between the first dielectric fin and the second dielectric fin along a second direction perpendicular to the first direction.

16. The semiconductor structure of claim 15, further comprising:
a gate structure wrapping around each of the plurality of nanostructures,
wherein the gate structure is spaced apart from the source/drain feature by the plurality of inner spacer features.

17. The semiconductor structure of claim 15,
wherein the first dielectric layer and the third dielectric layer comprise aluminum oxide, zirconium oxide, tantalum oxide, yttrium oxide, titanium oxide, or lanthanum oxide,
wherein the second dielectric layer comprises silicon oxide, silicon oxycarbonitride, silicon oxycarbide, or other low-k materials.

18. The semiconductor structure of claim 15, wherein the third dielectric layer is spaced apart from the plurality of nanostructures or the substrate by the first dielectric layer.

19. The semiconductor structure of claim 15,
wherein a dielectric constant of the first dielectric layer is greater than a dielectric constant of the second dielectric layer,
wherein a dielectric constant of the third dielectric layer is greater than the dielectric constant of the second dielectric layer.

20. The semiconductor structure of claim 15, wherein the second dielectric layer is porous.

* * * * *